US006818363B2

(12) United States Patent
Fincher et al.

(10) Patent No.: US 6,818,363 B2
(45) Date of Patent: Nov. 16, 2004

(54) AQUEOUS DISPERSIONS FOR COLOR IMAGING

(75) Inventors: Graciela Beatriz Blanchet Fincher, Greenville, DE (US); Ronald J. Convers, Towanda, PA (US); Gregory C. Weed, Towanda, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/258,566

(22) PCT Filed: May 11, 2001

(86) PCT No.: PCT/US01/15325

§ 371 (c)(1), (2), (4) Date: Oct. 24, 2002

(87) PCT Pub. No.: WO01/87634

PCT Pub. Date: Nov. 22, 2001

(65) Prior Publication Data

US 2003/0235768 A1 Dec. 25, 2003

Related U.S. Application Data

(60) Provisional application No. 60/204,636, filed on May 16, 2000.

(51) Int. Cl.$^{7}$ .............................. G03F 7/34; G03F 7/40; G03C 11/08

(52) U.S. Cl. ........................... 430/11; 430/14; 430/200; 430/201; 430/270.1; 430/964

(58) Field of Search ............................. 430/11, 14, 200, 430/201, 270.1, 964

(56) References Cited

U.S. PATENT DOCUMENTS

| | | | | |
|---|---|---|---|---|
| 5,085,698 A | | 2/1992 | Ma et al. | |
| 5,156,938 A | | 10/1992 | Foley et al. | |
| 5,171,650 A | | 12/1992 | Ellis et al. | |
| 5,219,945 A | | 6/1993 | Dicker et al. | |
| 5,256,506 A | | 10/1993 | Ellis et al. | |
| 5,334,573 A | | 8/1994 | Schild | |
| 5,427,847 A | | 6/1995 | Zawanda | |
| 5,521,035 A | | 5/1996 | Wolk et al. | |
| 5,534,387 A | | 7/1996 | Bodager et al. | |
| 5,593,808 A | | 1/1997 | Ellis | |
| 5,622,795 A | | 4/1997 | Ellis | |
| 5,681,681 A | | 10/1997 | Ellis | |
| 5,773,188 A | | 6/1998 | Ellis | |
| 6,294,308 B1 | * | 9/2001 | Caspar et al. | 430/200 |
| 6,551,757 B1 | * | 4/2003 | Bailey et al. | 430/964 |
| 2003/0138723 A1 | * | 7/2003 | Potbrick et al. | 430/200 |

FOREIGN PATENT DOCUMENTS

| | | |
|---|---|---|
| EP | 0432608 A3 | 6/1991 |
| EP | 0573013 A3 | 12/1993 |
| EP | 0599689 A2 | 12/1993 |
| EP | 0679531 A1 | 11/1995 |
| EP | 0799716 A2 | 10/1997 |
| EP | 0556649 B1 | 6/1999 |

OTHER PUBLICATIONS

McCutcheons's Functional Materials, North American Edition, Manufacturing Confection Publishing Co., Glen Rock, NJ 07452, pp. 110–129, 1990.

* cited by examiner

*Primary Examiner*—Richard L. Schilling
(74) *Attorney, Agent, or Firm*—Thomas H. Magee

(57) ABSTRACT

A thermally imageable layer comprising an aqueous dispersion containing an immiscible compound, typically a near infrared absorber, and a dispersant, typically an acrylic polymer, which layer is useful in laser induced colorant transfer processes.

21 Claims, 7 Drawing Sheets

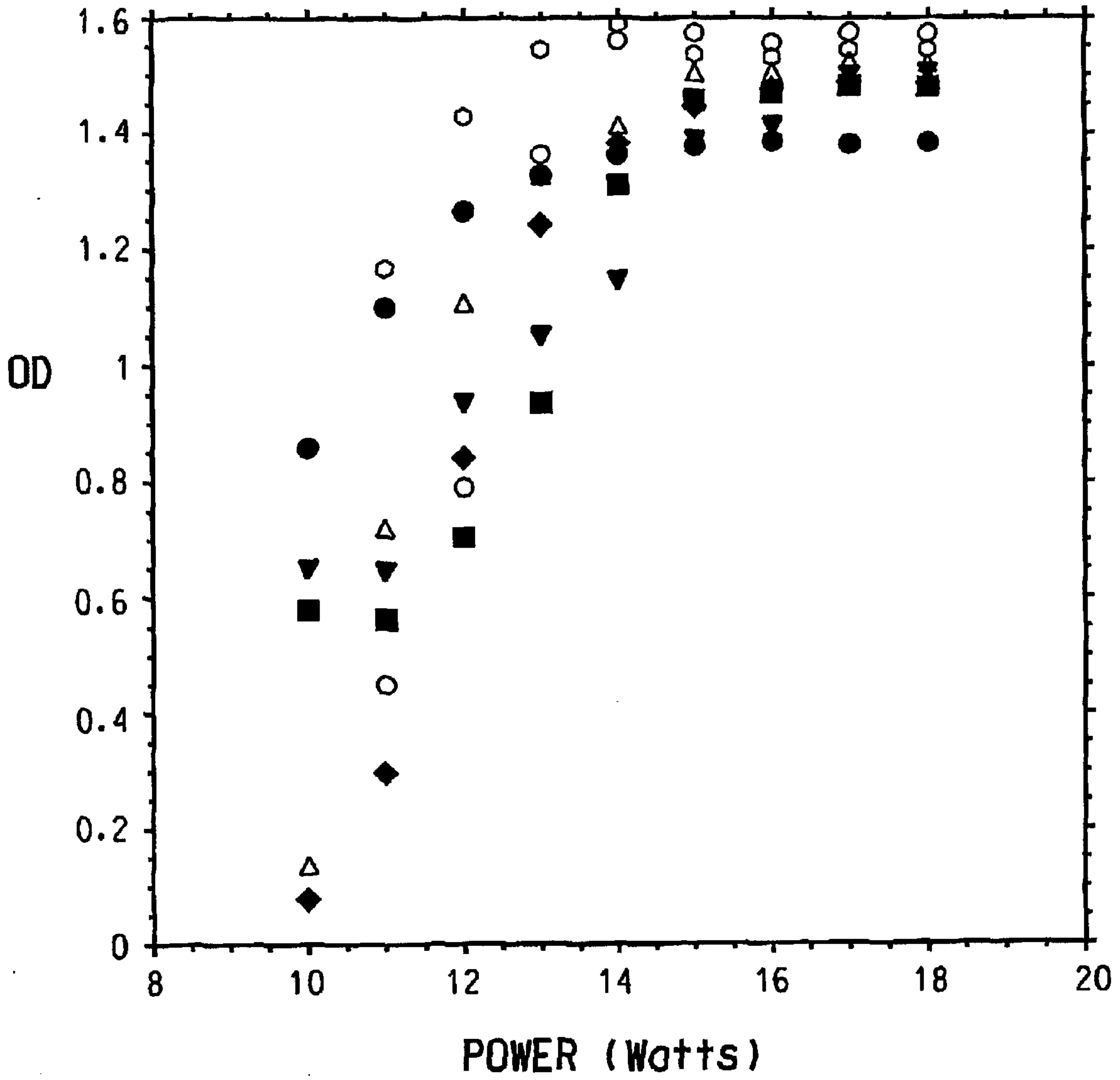
FIG. 9
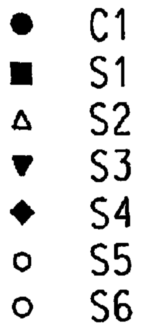

● power V control Cy
■ power V sample 7
△ power V sample 8

● power V control M
■ power V sample 9
△ power V sample 12

AQUEOUS DISPERSIONS FOR COLOR IMAGING

CROSS REFERENCE TO RELATED APPLICATIONS

This application claims the benefit of prior filed provisional application No. 60/204,636 filed on May 16, 2000 which is incorporated herein by reference in its entirety.

FIELD OF THE INVENTION

This invention relates to aqueous dispersions containing immiscible compounds for color imaging and products therefrom, and more particularly their use in laser-induced thermal transfer imaging.

BACKGROUND OF THE INVENTION

Laser-induced thermal transfer processes are well-known in applications such as color proofing.

Laser-induced processes use a laserable assemblage comprising a donor element that contains a thermally imageable layer, the exposed areas of which are transferred to a temporary or a final receiver element by exposure to laser radiation which induces transfer of exposed areas of the thermally imageable layer from the donor element to the temporary or final receiver element. The (imagewise) exposure takes place only in a small, selected region of the laserable assemblage at one time, so that transfer of material from the donor element to the receiver element can be built up one pixel at a time. Computer control produces transfer with high resolution and at high speed.

In general, thermally imageable layers are designed so that additives and other ingredients are soluble in the coating solvent. Solubility considerations limit the range of additives and other ingredients that can be included in the coating solution. It is known to employ certain dispersants to disperse pigment particles, which are on the order of about 1 micron. However, dispersing immiscible compounds of larger size in thermally imageable, especially aqueous, coatings has not been described.

Infrared absorbing compounds are used in thermally imageable layers of donor elements. The IR absorbing compound acts as a light absorber. Exposure engines for thermal films using laser diodes, emitting in the 780 to 850 nm range, have become the standard in the industry and, therefore, a variety of IR absorbing compounds, with absorption spectra matching the emission of these laser diodes have also been synthesized. The preferred IR absorbing compounds have high absorbance at the wavelength of the incoming laser beam. Upon exposure, an IR absorbing compound absorbs the incoming radiation creating sufficient heat to transfer of the thermally imageable layer onto the receiver. However, the limited solubility of some IR absorbing compounds, especially in water, considerably limits the choice of IR absorbing compounds used in formulating donor elements.

SUMMARY OF THE INVENTION

The thermally imageable layer of the instant invention permits a broad range of immiscible compounds to be included in a thermally imageable layer without concern for this solubility. The invention overcomes the solubility problem by formulating a thermally imageable layer which comprises a dispersion of an immiscible compound. Thus, compatibility of the coating solvent with an immiscible compound is no longer a limiting factor for the choice of materials.

A thermally imageable layer which comprises a dispersed immiscible compound has been discovered which is suitable for use in thermal imaging without the problems associated with aqueous coating solutions containing certain immiscible compounds. Surprisingly, an aqueous dispersion has been discovered which is effective as a thermally imageable layer.

In one embodiment, the invention relates to a donor element comprising a thermally imageable layer comprising an aqueous dispersion comprising an immiscible compound and a polymeric dispersant, wherein the immiscible compound is a thermal amplification additive.

In another embodiment, the invention relates to a method of making a donor element comprising forming a dispersion of an immiscible compound and a polymeric dispersant, wherein the immiscible compound is a thermal amplification additive and applying the dispersion to a support.

In yet another embodiment, the invention relates to a method for making an image comprising:

(1) imagewise exposing to laser radiation a laserable assemblage comprising:
   - (A) a donor element comprising a thermally imageable layer prepared from an aqueous dispersion comprising an immiscible compound and a polymeric dispersant, wherein the immiscible compound is a thermal amplification additive; and
   - (B) a receiver element in contact with the thermally imageable layer of the donor element; the receiver element comprising:
     - (a) an image receiving layer; and
     - (b) a receiver support;

whereby the exposed areas of the thermally imageable layer are transferred to the receiver element to form an image on the image receiving layer;

(2) separating the donor element (A) from the receiver element (B), thereby revealing the image on the image receiving layer of the receiver element.

The so formed image may then be transferred to a permanent substrate by bringing the element formed in (2) in contact with the permanent substrate, followed by peeling away the receiver support.

In still another embodiment, the invention relates to a printed proof comprising:

an image receiving layer having an outer surface with a halftone dot thermal image applied thereto by imagewise exposure of a donor element comprising a thermally imageable layer comprising an aqueous dispersion comprising an immiscible compound and a polymeric dispersant, wherein the immiscible compound is a thermal amplification additive.

In still another embodiment, the invention relates to a method for making a color filter element on a substrate comprising thermally mass transferring a pigment colorant from a donor element to the substrate to form a pattern of at least one color on the substrate and then associating a liquid crystal display device with said pattern so that upon electronically addressing of liquid crystal within said liquid crystal display device at least a portion of the pattern of at least one color becomes visible, the donor element comprising a thermally imageable layer comprising an aqueous dispersion comprising the pigment colorant, an immiscible compound and a polymeric dispersant, wherein the immiscible compound is a thermal amplification additive.

BRIEF DESCRIPTION OF THE DRAWINGS

FIG. 9 is a plot of laser fluence v. optical density for the control and Samples 1 to 6 of Example 1.

DETAILED DESCRIPTION OF THE INVENTION

Figure 1:
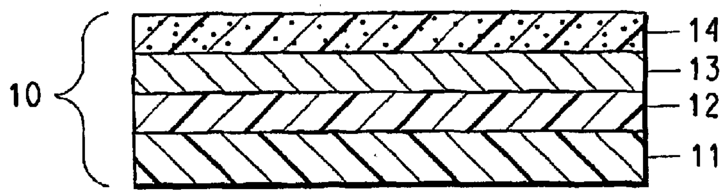
FIG. 1 is a simplified schematic diagram of a donor element of this invention.

An immiscible compound of this invention is dispersed with a polymeric dispersant to form a thermally imageable layer containing an immiscible compound.

A material that is insoluble in the solvent, usually water, that is used in the preparation of the thermally imageable layer is the immiscible compound. The contemplated immiscible compounds are larger in particle size than the pigment particles and polymer particles which are typically dispersed into a thermally imageable layer used in thermal imaging. Pigment particles are usually on the order of about 1 micron or less while the contemplated immiscible compounds are, typically, larger in particle size. In general, these immiscible compounds are not colloidal sized particles as are the polymer particles or dye particles. The particle size generally is selected with a view towards the thickness of the layer in which it is used. For a coating of as low as 8 mg/sq dm (about 650 nm) in thickness the immiscible compound is usually at least about 1 nm in particle size and up to about 300 nm in particle size, more typically about 1 nm to about 100 nm. However, typical colloids range from between about 1 nm and about 100 nm in particle size. To exemplify the pigment particle sizes contemplated, a reasonable pigment particle size for dispersed iron oxide is about 50 nm and for dispersed titanium oxide about 250 nm. The recognized, typical dispersion particle size (by PARSAT) is less than 200 nm. An example of a useful immiscible compounds is a thermal amplification additive. A specific example of a useful thermal amplification additive is an IR absorbing compound.

The thermal amplification additive amplifies the effect of the heat generated in the heating layer and thus increases sensitivity so less laser power (energy) is needed for exposure. The additive should be stable at room temperature. The additive can be (1) a compound which, when heated, decomposes to form gaseous by products(s), (2) an IR absorbing compound which absorbs the incident laser radiation, or (3) a compound which undergoes a thermally induced unimolecular rearrangement which is exothermic. Combinations of these types of additives may also be used.

Thermal amplification additives, which are immiscible in the coating solvent and decompose upon heating include those which decompose to form nitrogen, such as diazo alkyls, diazonium salts, and azido (—N3) compounds; ammonium salts; oxides which decompose to form oxygen; carbonates; peroxides. Mixtures of additives can also be used. Preferred thermal amplification additives of this type are diazo compounds such as 4-diazo-N,N' diethyl-aniline fluoroborate (DAFB).

When the thermal amplification additive is an IR absorbing compound, its function is to absorb the incident radiation and convert it into heat, leading to more efficient transfer. It is preferred that the IR absorbing compound absorb in the infrared region. For imaging applications, it is also preferred that the IR absorbing compound have very low absorption in the visible region. Examples of suitable immiscible IR absorbing compounds which can be used alone or in combination include poly(substituted) phthalocyanine compounds and metal-containing phthalocyanine compounds; cyanine dyes; squarylium dyes; chalcogenopyryioacrylidene dyes; croconium dyes; metal thiolate dyes; bis(chalcogenopyrylo) polymethine dyes; oxyindolizine dyes; bis(aminoaryl) polymethine dyes; merocyanine dyes; and quinoid dyes. Some useful solvent soluble dyes include 3-H-Indolium, 2-[2-[2-chloro-3-dihydro-1,3,3-trimethyl-2H-indol-2-ylidene)ethylidene]-1-cyclopenten-1-yl]ethyenyl]-1,3,3-trimethyl-, salt with trifluoromethane sulfonic acid (1:1), CAS #128433-68-1; Thiopyrylium, 4-((3-((2,6-bis(1,1-dimethylethyl)-4H-thiopyran-4-ylidene)methyl)-2-hydroxy-4-oxo-2-cyclobuten-1-ylidene)methyl)-2,6-bis(1,1-dimethylethyl)-, inner salt, CAS #88878-493, sold as CHI4664 and 2-(2-(2-chloro-3-(2-(1,3-dihydro-1,1-dimetlhyl-3-(4-sulfobutyl)-2H-benz[e]indol-2-ylidene)ethylidene)-1-cyclohexene-1yl)ethenyl)-1,1-dimthyl-3-(4-sulfobutyl)-1H-benz[e]indoluim, inner salt, free acid with CAS Registry Number 162411-28-1; and 3H-Indolium, 2-[2-[3-[(1,3-dihydro-1,3,3-trimethyl-2H-indol-2-ylidene)ethylidene]-2-(2-pyrimidinylthio)-1-cyclopenten-1-yl]-1,3,3-trimethyl-, salt with trifluoromethanesulfonic acid (1:1) with CAS# 162093-14-3.

Some other useful dyes include dyes having this backbone 3H-Indolium, 2-[2-[2-(2-benzoxazolylthio)-3-[(1,3-dihydro-1,3,3-trimethyl-2H-indol-2-ylidene)ethylidene]-1-cyclopenten-1-yl]ethenyl]-1,3,3-trimethyl-. Other useful dyes include those wherein in place of -cyclopenten- -cyclohexen- is used, -cyclohepten-; in place of 2-benzoxazolythio) -2-chloro-, -2-methyl-, 2-pyrimidinylthio, [-2-[(1-phenyl-1H-tetrazol-5-yl)], 2-phenylthio, -2-ethyl-, -2-phenyloxy or -2-methylthio- is used; and in place of the two 1,3,3-trimetlhyl groups, the following is substituted: 1-ethyl-3,3-dimethyl-, 1-propyl-3,3-dimethyl, 1-phenyl-3,3-dimethyl, 1-octyl-3,3-dimethyl-, or 1-butyl-3,3-dimethyl. Further by replacing one of the methyl groups with methyl, ethyl, propyl, butyl, pentyl, hexyl, 2,3-dimethyloctyl, etc. additional useful dyes may be obtained. Any alkyl or substituted alkyl group that lack an ionic, water-solubilizing group would also be useful.

Additional infrared absorbers may be generated by replacing the 3H-Indolium with 3H-Benzothiazolium, 3H-Benzoxazolium, 3H-Naphth-indolium. Some useful counterions include bromide, chloride, perchlorate and "Tosylate", a contraction for "para-Toluenesulfonate", the anion formed by neutralizing para-toluenesulfonic acid with base. Tosylate is an organic soluble, inert anion which functions similarly to anions like chloride, bromide, etc. The structural formula of Tosylate is:

para CH3-C6H4-SO3- (−1) charge

When present in the thermally imageable layer, the thermal amplification weight percentage is generally at a level of about 0.95 to about 11.5%. The percentage can range up to about 25% of the total weight percentage in the thermally imageable layer. These percentages are non-limiting and one of ordinary skill in the art can vary them depending upon the particular composition of the thermally imageable layer.

A compound that reduces surface tension in aqueous solutions is used in a suspending medium to promote uniform and maximum separation of the fine solid particles or immiscible particles of the thermally imageable layer.

Examples of suitable dispersants include polymeric materials which can be AB, BAB or ABC block or random copolymers. Most typical are dispersants made by a group transfer polymerization process because these are free from higher molecular weight species.

Suitable AB or BAB block copolymers, and the synthesis thereof, are disclosed in U.S. Pat. No. 5,085,698. Suitable ABC triblock copolymers, and their synthesis, are disclosed in Ma et al., EPO Publication 0556649 A1, published Aug. 25, 1993, and U.S. Pat. No. 5,219,945.

Usually the dispersant comprises a monomer which is an alkyl acrylate, alkyl methacrylate, acrylic acid or methacrylic acid or styrene.

Typically the alkyl groups contain about 1 to 6 carbon atoms. Examples of alkyl groups include methyl, ethyl and n-butyl.

A typical dispersant is a graft polymer with a backbone comprising an acrylic polymer with acrylic polymer "arms". The backbone may be an alkyl acrylate/alkyl acrylate/acrylic acid terpolymer in which the alkyl groups range from about 1 to about 6 carbon atoms. The arms may be alkyl acrylate/acrylic acid copolymers in which the alkyl groups range from about 1 to about 6 carbon atoms. In one specific embodiment of a graft copolymer of this kind the copolymer contains about 69% backbone comprising butyl acrylate/methyl acrylate/acrylic acid in a proportion of about 45.5 to about 45.5 to about 9 and about 31% arms comprising methyl methacrylate/methacrylic acid in a proportion of about 71.25 to about 28.75.

Another kind of dispersant is a block copolymer of styrene and methacrylate. Yet another kind of dispersaant is a block copolymer of methyl methacrylate and n-butylmethacrylate.

The dispersant is generally present in the range of about 0.1 to about 30% by weight, more typically about 0.5 to about 8% by weight, based on the weight of the total composition of the coating. Dispersion stability of the immiscible compound is adversely affected if insufficient polymeric dispersant is present; that is, the immiscible compound has been found to settle out of the solution.

In addition to, or in place of the typically used polymeric dispersant compounds, anionic, cationic, nonionic, or amphoteric dispersants may be used. A detailed list of non-polymeric as well as some polymeric dispersants is provided in the section on dispersants, pages 110–129, 1990 McCutcheon's Functional Materials, North American Edition, Manufacturing Confection Publishing Co., Glen Rock, N.J. 07452.

A surfactant additive that reduces surface tension and enhances the surface characteristics of the dispersion which forms the thermally imageable layer can also be used. Surfactants can be added to enhance coatability of the dispersion. A surfactant may also to some degree perform the function of a dispersant for the immiscible compound. Examples of surfactants include fluorosurfactants, such as the Zonyl® line of surfactants available from E.I. duPont de Nemours and Company of Wilmington, Del., or alkyphenol ethoxylate sulfates such as the "PolyStep" line of sulfates commercially available from Stepan Company of Northfield, Ill., for example, ammoniurm noniylphenol ethoxylate sulfate sold under the tradename "PolyStep B-1".

Suitable non-water soluble infrared absorbers in aqueous formulations are made by making an aqueous dispersion of the desired immiscible compound. We have found that an aqueous dispersion of a water insoluble IR absorber permits this immiscible compound to be used in the aqueous formulations that make up the thermally imageable layer. We have found that the use of dispersions of IR absorbers which are insoluble in the solvent results in a thermally imageable layer which demonstrates comparable sensitivity and resolution to those formulated with a soluble absorber.

The dispersion of the immiscible compound in the dispersant is prepared by mixing together the required amounts of the dispersant, water and, if needed, a neutralization agent for neutralizing the dispersant, for example 2-amino-2-methyl-1-propanol. Some additional typically used neutralizing agents for dispersants include organic bases, such as amines and inorganic bases, such as potassium hydroxide or sodium hydroxide for anionic dispersants and organic acids, such as toluene sulfonic acid or acetic acid, or inorganic acids such as phosphoric acid or hydrochloric acid for cationic dispersants. Optionally cosolvents may be present. Some typically used cosolvents include alkyl polyglycol ethers such as dipropylene glycol methyl ether or diethylene glycol n-butyl ether; pyrrolidones; polyethylene glycols and glymes (glycol ethers used as aprotic solvents).

The immiscible compound is added to the mixture of dispersant, water and optional neutralizing agent in the required amount and the mixture is mixed. Conventional mixing devices may be used for dispersion of the immiscible compound in the dispersant. One such device includes an Omni Mixer. Typically it is run at about 5000 to about 8000 rpm for about 30 to about 90 minutes to insure adequate mixing. Other mixing devices include a high speed dispersers or Waring blenders. The resultant dispersion can be easily redispersed with shaking if it settles. A masterbatch of the dispersant and immiscible compound may need to be formulated if the loading level of immiscible compound is to exceed about 10 weight % of the entire weight of the composition of the thermally imageable layer.

Donor Element

These dispersions are useful in preparing donor elements comprising a support and a thermally imageable layer containing a colorant.

Additional layers such as a heating layer or an intermediate layer selected from the group consisting of a subbing layer or an ejection layer or both may also be present.

An example of a suitable donor element is shown in FIG. 1. The donor element comprises a thermally imageable layer (14) which is prepared from an aqueous dispersion comprising an immiscible compound and a polymeric dispersant. The donor element further comprises a base element having a layer with a coatable surface. Optionally, the donor element comprises an intermediate layer (12) a heating layer (13) and a donor support (11). Typically, the heating layer (13) is located directly on the support (11).

Typically, the donor support is a thick (400 guage) coextruded polyethylene terephthalate film. Alternately, the donor support is a polyester film, specifically polyethylene terephthalate that has usually been plasma treated to accept the heating layer. When the donor support is plasma treated, an intermediate layer is usually not provided on the donor support. Backing layers may optionally be provided on the side of the donor support opposite the side of the support with the thermally imageable layer. These backing layers may contain fillers to provide a roughened surface on the back side of the donor support. Alternately, the donor support itself may contain fillers, such as silica, to provide a roughened surface on the back surface of the support.

The optional intermediate layer (12), as shown in FIG. 1, is the layer that may provide additional force to effect transfer of the thermally imageable layer to the receiver element in the exposed areas.

If the laserable assemblage is imaged through the intermediate layer, the intermediate layer should be capable of transmitting the laser radiation, and not be adversely affected by this radiation.

The intermediate layer may be an ejection layer which, when heated, decomposes into gaseous molecules providing the necessary pressure to propel or eject the exposed areas of the thermally imageable layer onto the receiver element. This is accomplished by using a polymer having a relatively low decomposition temperature (less than about 350° C., preferably less than about 325° C., and more preferably less than about 280° C.). In the case of polymers having more than one decomposition temperature, the first decomposition temperature should be lower than about 350° C. In a typical embodiment, the ejection layer is flexible. In order for the ejection layer to have suitably high flexibility and conformability, it should have a tensile modulus that is less than or equal to about 2.5 Gigapascals (GPa), preferably less than about 1.5 GPa, and more preferably less than about 1 GPa. It has been found beneficial if the polymer chosen is dimensionally stable.

When the intermediate layer functions as an ejection layer, examples of suitable polymers include (a) polycarbonates having low decomposition temperatures (Td), such as polypropylene carbonate; (b) substituted styrene polymers having low decomposition temperatures, such as poly (alpha-methylstyrene); (c) polyacrylate and polymethacrylate esters, such as polymethylmethacrylate and polybutylmethacrylate; (d) cellulosic materials having low decomposition temperatures (Td), such as cellulose acetate butyrate and nitrocellulose; and (e) other polymers such as polyvinyl chloride; poly(chlorovinyl chloride) polyacetals; polyvinylidene chloride; polyurethanes with low Td; polyesters; polyorthoesters; acrylonitrile and substituted acrylonitrile polymers; maleic acid resins; and copolymers of the above. Mixtures of polymers can also be used. Additional examples of polymers having low decomposition temperatures can be found in Foley et al., U.S. Pat. No. 5,156,938. These include polymers which undergo acid-catalyzed decomposition. For these polymers, it is frequently desirable to include one or more hydrogen donors with the polymer.

Preferred polymers for the ejection layer are polyacrylate and polymeth-acrylate esters, low Td polycarbonates, nitrocellulose, poly(vinyl chloride) (PVC), and chlorinated poly(vinyl chloride) (CPVC). Most preferred are poly(vinyl chloride) and chlorinated poly(vinyl chloride).

Other materials can be present as additives in the intermediate layer as long as they do not interfere with the essential function of the layer. Examples of such additives include coating aids, flow additives, slip agents, antihalation agents, plasticizers, antistatic agents, surfactants, and others which are known to be used in the formulation of coatings.

The intermediate layer may also be a subbing layer (12) to provide a donor element having in order at least one subbing layer (12), optionally, a heating layer (13), and at least one thermally imageable layer(14).

When the intermediate layer is a subbing layer, it is characterized by an ability to adhere to an adjacent layer of the donor element, such as the heating layer or the support. Examples of suitable materials for the subbing layer include polyurethanes, polyvinyl chloride, cellulosic materials, acrylate or methacrylate homopolymers and copolymers, and mixtures thereof. Other custom made decomposable polymers may also be useful in the subbing layer. Preferably useful as subbing layers for polyester, specifically polyethylene terephthalate, are acrylic subbing layers. Preferably, the subbing layer has a thickness of 100 to 1000 A.

The optional heating layer (13) of the base element, as shown in FIG. 1, is deposited on the optional intermediate layer (12). More typically, the heating layer (13) is deposited directly on the support (11). The function of the heating layer is to absorb the laser radiation and convert the radiation into heat. Materials suitable for the heating layer can be inorganic or organic and can inherently absorb the laser radiation or include additional laser-radiation absorbing compounds.

Examples of suitable inorganic materials are transition metal elements and metallic elements of Groups IIIA, IVA, VA, VIA, VIIIA, IIIB, and VB, their alloys with each other, and their alloys with the elements of Groups IA and IIA of the Periodic Table of the Elements (IUPAC) and oxides. Tungsten (W) is an example of a Group VIA metal that is suitable and which can be utilized. Carbon (a Group IVB nonmetallic element) can also be used. Preferred metals include Al, Cr, Sb, Ti, Bi, Zr, TiO2, Ni, In, Zn, and their alloys; carbon is a preferred nonmetal. More preferred metals and nonmetals include Al, Ni, Cr, Zr and C. Most preferred metals are Al, Ni, Cr, and Zr. An oxide found to be useful is $TiO_2$.

The thickness of the heating layer is generally about 20 Angstroms to about 0.1 micrometer, preferably about 40 to about 100 Angstroms.

Although it is preferred to have a single heating layer, it is also possible to have more than one heating layer, and the different layers can have the same or different compositions, as long as they all function as described above. The total thickness of all the heating layers should be in the range given above, i.e., about 20 Angstroms to about 0.1 micrometer.

The heating layer(s) can be applied using any of the well-lnown techniques for providing thin metal layers, such as sputtering, chemical vapor deposition, and electron beam.

The thermally imageable layer (14) of the donor element is formed by applying a coating composition, typically, containing colorant, to a surface of the base element of the donor element.

A film forming ingredient, which is a binder, can be added to the composition of the thermally imageable layer. Sometimes the dispersant will also function as a binder and therefore avoid the need for an additional ingredient to function as a binder. However, this may not always be the case so a separate binder might be required if the dispersant alone does not adequately serve as a binder.

The binder for the thermally imageable layer is usually a polymeric material having a decomposition temperature that is greater than about 300° C. and preferably greater than about 350° C. The binder should be film forming and coatable from solution or from a dispersion. Binders having melting points less than about 250° C. or plasticized to such an extent that the glass transition temperature is less than about 70° C. are preferred. However, heat-fusible binders, such as waxes should be avoided as the sole binder since such binders may not be as durable, although they are useful as cobinders in decreasing the melting point of the top layer.

It is preferred that the binder does not self-oxidize, decompose or degrade at the temperature achieved during the laser exposure so that the exposed areas of the thermally imageable layer comprising a colorant and a binder, are transferred intact for improved durability.

Usually the binder comprises a monomer which is an alkyl acrylate, alkyl methacrylate, acrylic acid or methacrylic acid, acrylonitrile or styrene.

Typically the alkyl groups contains about 1 to 6 carbon atoms. Examples of alkyl groups include methyl, ethyl and n-butyl. Optionally, the alkyl group contains one or more heteroatoms. A typical heteroatom is oxygen. For example, the alkyl group can contain a hydroxy or epoxy substituent.

Examples of suitable binders include copolymers of styrene and (meth)acrylate esters, such as styrene/methacrylate copolymer, styrene/methyl-methacrylate copolymer; copolymer of styrene and olefin monomer, typically containing about 1 to about 4 carbon atoms, such as styrene/ethylene/butylene; copolymers of styrene and acrylonitrile; fluoropolymers; copolymers of (meth)acrylate esters with ethylene and carbon monoxide; polycarbonates having decomposition temperatures higher than 300° C., typically 280° C.; (meth)acrylate homopolymers and copolymers; polysulfones; polyurethanes; polyesters. The monomers for the above polymers can be substituted or unsubstituted. Mixtures of polymers can also be used.

An example is a copolymer comprising styrene, methyl methacrylate, butyl acrylate, methacrylic acid and glycedol methacryate or a copolymer comprising styrene, methyl methacrylate, methacrylic acid and glycedol methacrylate.

Preferred binder compositions for the thermally imageable layer include, but are not limited to, acrylate homopolymers and copolymers, methacrylate homopolymers and copolymers, (meth)acrylate block copolymers, and (meth) acrylate copolymers containing other comonomer types, such as styrene. Specific examples include butyl acrylate/methyl acrylate/acrylic acid; styrene/methyl methacrylate/butyl acrylate/methacrylic acid and glycedol methacrylate polymers.

A plasticizer may also be included which, typically is a low glass transition temperature polymer, that acts as a softener when the polymer of the binder has a high glass transition temperature. An example of a suitable plasticizer is polyethylene glycol.

The binder generally has a concentration of about 15 to about 50% by weight, based on the total weiglht of the thermally imageable layer, typically about 30 to about 40% by weight based on the total weight of the thermally imageable layer.

When the thermally imageable layer imparts a color image, e.g., in color proofing or color filter manufacturing, the colorant of the thermally imageable layer can be a pigment or a dye, typically a non-sublimable dye. Typically pigments are used as the colorant for stability and for color density, and also for the high decomposition temperature. Examples of suitable inorganic pigments include carbon black and graphite. Examples of suitable organic pigments include Rubine F6B (C.I. No. Pigment 184); Cromophthal® Yellow 3G (C.I. No. Pigment Yellow 93); Hostaperm® Yellow 3G (C.I. No. Pigment Yellow 154); Monastral® Violet R (C.I. No. Pigment Violet 19); 2,9-dimethylquinacridone (C.I. No. Pigment Red 122); Indofast® Brilliant Scarlet R6300 (C.I. No. Pigment Red 123); Quindo Magenta RV 6803; Monastral®\ Blue G (C.I. No. Pigment Blue 15); Monastral® Blue BT 383D (C.I. No. Pigment Blue 15); Monastral® Blue G BT 284D (C.I. No. Pigment Blue 15); and Monastral® Green GT 751D (C.I. No. Pigment Green 7). Combinations of pigments and/or dyes can also be used. For color filter array applications, high transparency pigments (that is at least about 80% of light transmits through the pigment) are preferred, having small particle size (that is about 100 nanometers).

In some embodiments of this invention, a pigment, such as carbon black, is present in a thermally imageable layer. This type of pigment functions as both a heat absorber and a colorant, and thus provides a dual function of being both a heating layer and a thermally imageable layer. The characteristics are the same as those for the thermally imageable layer. In this aspect, a preferred pigment which functions as colorant and heat absorber is carbon black.

The pigment and the immiscible compound are dispersed separately then combined together alternatively they are combined and then dispersed. Preparing separate dispersions has the advantage of allowing different concentrations to be used.

In accordance with principles well known to those skilled in the art, the concentration of colorant will be chosen to achieve the optical density desired in the final image. The amount of colorant will depend on the thickness of the active coating and the absorption of the colorant. Optical densities of any suitable value, usually greater than about .0.2, at the wavelength of maximum absorption are typical. Sometimes, high optical densities, e.g. greater than about 3.0 are preferred. Optical densities adequate for a particular application can be achievable with this invention.

Advantages of the invention in color proofing processes include broad sensitivity over a desirable laser power range (e.g., about 12 to about 18 watts), high resolution as evidenced by the holding of 1 pixel checker board patterns (10 microns by 10 microns), excellent overprints whereby uniform color blends are achieved with multicolor images (e.g., red and yellow layered to produce a uniform orange color lacking yellow or red stripes or spots) and minimal to no border solid tearing; that is, transfer of two adjacent solid colors result in a clean line between the colors as opposed to a ragged or rough line at the color boundary.

A dispersant is usually present when employing pigment colorants. The colorant dispersant achieves maximum color strength, transparency and gloss. The colorant dispersant may be the same or different from that used to disperse the immiscible compound. The colorant dispersant is generally an organic polymeric compound and is used to separate the fine pigment particles and avoid flocculation and agglomeration. A wide range of colorant dispersants are commercially available. A colorant dispersant will be selected according to the characteristics of the pigment surface and other components in the composition as practiced by those skilled in the art. However, one class of colorant dispersant suitable for practicing the invention is that of the AB dispersants. The A segment of the dispersant adsorbs onto the surface of the pigment. The B segment extends into the solvent into which the pigment is dispersed. The B segment provides a barrier between pigment particles to counteract the attractive forces of the particles, and thus to prevent agglomeration. The B segment should have good compatibility with the solvent used. The AB dispersants of choice are generally described in U.S. Pat. No. 5,085,698. Conventional pigment dispersing techniques, such as ball milling, sand milling, etc., can be employed.

The colorant is usually present in an amount of from about 25 to about 95% by weight, typically about 35 to about 65% by weight, based on the total weight of the thermally imageable layer.

Any suitable solvent can be used as a coating solvent for the thermally imageable layer, as long as it does not deleteriously affect the properties of the assemblage. The layer is applied to the base element of the donor element using conventional coating techniques or printing techniques, for example, graver printing. A preferred solvent is water. The thermally imageable layer may also be applied using the WATERPROOF® Color Versatility Coater sold by DuPont, Wilmington, Del. The thennally imageable layer can thus be applied shortly before the exposure step. This also allows for the mixing of various basic colors together to fabricate a wide variety of colors to match the Pantene® color guide currently used as one of the standards in the proofing industry.

The thermally imageable layer generally has a thiclkess in the range of about 0.1 to about 5 micrometers, preferably in the range of about 0.1 to about 1.5 micrometers. Thickness greater than about 5 micrometers are generally not preferred as they require excessive energy in order to be effectively transferred to the receiver.

Although it is preferred to have a single thermally imageable layer, it is also possible to have more than one thermally imageable layer, and the different layers can have the same or different compositions, as long as they all function as described above. The total thiclkess of the combined thermally imageable layers should be in the range given above.

Additional Additives:

Other materials can be present as additives in the thermally imageable layer as long as they do not interfere with the essential function of the layer. Examples of such additives include coating aids, plasticizers, flow additives, slip agents, antihalation agents, antistatic agents, surfactants, and others which are known to be used in the formulation of coatings. However, it is preferred to minimize the amount of additional materials in this layer, as they may deleteriously affect the final product after transfer. Additives may add impart unwanted color are usually avoided for color proofing applications as well as those additives that tend to decrease durability and print life in lithographic printing applications. With the instant invention, immiscible additives can be used.

Additional layers:

The donor element may have additional layers (not shown) as well. For example, an antihalation layer may be used on the side of the optional intermediate layer opposite the thermally imageable layer. Materials which can be used as antihalation agents are well known in the art. Other anchoring or subbing layers can be present on either side of the intermediate layer and are also well known in the art.

Color Filter

The donor element can be used for color filters for use in liquid crystal display (LCD) devices.

For color filter applications, a dye or pigment is present in the thermally imageable layer of the donor element, typically, the donor element contains a cross-linkable polymer. A cross-linkable polymer can also be used in the image receiving layer. In one embodiment, the dispersant may be crosslinlkable. In a cross-linkable polymer, typically, 1–5 mol-% of a cross-linkable monomer is incorporated into the polymeric binders of the instant invention. After cross-linking, the binders exhibit resistance to the temperatures and solvents employed in the formation of color filter arrays in liquid crystal display devices, making this embodiment highly useful in that application. Suitable cross-linkable comonomers include but are not limited to hydroxy ethyl methacrylate and glycidyl methacrylate. Moreover, one or more of the polymeric binders may comprise monomer units having pendant groups which are capable of undergoing free-radical induced or cationic crosslinking reactions. Pendant groups which are capable of undergoing free-radical induced crosslinking reactions are generally those which contain sites of ethylenic unsaturation, such as mono- and polyunsaturated alkyl groups; acrylic and methacrylic acids and esters. In some cases, the pendant crosslinking group can be photosensitive, as is the case with pendant cinnamoyl or N-alkyl stilbazolium groups. Pendant groups which are capable of undergoing cationic crosslinking reactions include substituted and unsubstituted epoxide and aziridine groups. Cross-linkable binders suitable for the practice of the invention can be formed by direct copolymerization of one or more ethylenically unsaturated dicarboxylic acid anhydrides, or the corresponding alkyl diesters, with one or more of the above comonomers. Suitable ethylenically unsaturated dicarboxylic acid anhydrides are, for example, maleic anhydride, itaconic acid anhydride and citraconic acid anhydride and alkyl diesters such as the diisobutyl ester of maleic anhydride. The copolymer binder containing acid anhydride functionality can be reacted with primary aliphatic or aromatic amines.

The dye and/or pigment(s) for color filter applications are chosen such that optical densities on the receiver element in areas where material has been transferred are preferably between 1.0 and 2.0 for red, blue and green, and between 3.0 and 4.0 for black. In general, the dye and/or pigment(s) are present in an amount of from about 20 to about 80% by weight, more typically about 30 to about 50% by weight, based on the total weight of the transfer coating.

In its simplest form, a liquid crystal display device consists of a liquid crystal layer with opposite sides, a set of electrodes on either side of the liquid crystal layer, and an alignment polymer layer between each set of electrodes and the liquid crystal layer. Alignment of the liquid crystal molecules occurs at a certain angle, referred to as the tilt angle, with respect to the plane of the inside of two substrates, e.g., glass plates, plastic sheets, quartz plates, or others which support the electrodes. The inside of the substrates have coatings of sets of transparent electrodes (electrical conductors), usually indium-tin oxide (ITO). The sets of electrodes are patterned compatible with the information to be displayed by the LCD. The two substrates are adhered together using appropriate spacers to preserve a constant thickness to a space or gap between substrate, and filled with various mixtures of liquid crystal materials.

Typically, color filter array element is included on the outside of one of the two substrates which support the electrodes prior to forming the LCD device. However, in forming such a liquid crystal display device the color filter array to be used therein may have to undergo rather severe heating and treatment steps during manufacture. For example, the transparent conducting layer such as ITO, is usually vacuum sputtered onto the substrate having the color filter array element which is then cured. This curing step may take place at temperatures as high as 250° C. for times which may be as long as an hour. This is followed by coating with the thin polymeric alignment layer for the liquid crystals, such as polyamide. The surface finish of the alignment layer may require rubbing or may require curing for up to several hours at elevated temperatures. The color filter layer on the substrate is capable of surviving the subsequent processing steps associated with the formation of the LCD device.

For color filter applications, the dye or pigment is present in the thermally imageable layer. For color filter applications the thermally imageable layer can be such that optical densities on the receiver element in areas where material has been transferred are preferably between 1.0 and 2.0 for red, blue and green, and between 3.0 and 4.0 for black.

For color filter applications the receiver element can be different from the receiver element used in color proofing. The receiver element can include the permanent substrate such as a glass substrate optionally with an image-receiving layer, and polarizing filter elements and flexible glass. In color filter array applications, the receiver element can be an intermediate element onto which a multicolor image in which the additive primary colors (red, green, and blue) are formed into a mosaic pattern in a black matrix. The color image can then be transferred, for example by lamination, to a receptor element such as, for example, a flexible glass substrate or a polarizing filter element associated with the LCD device. The glass substrate may optionally have one or more layers to receive and adhere the color image layer to glass. Examples of materials which are suitable to receive the color image to the glass substrate include ethylene copolymers, adhesion promotors, and UV crosslinkable adhesives.

A particularly suitable polarizing filter element is one which is used for thin film transistor (TFT) color filters. The color image on the receiver element (which is an intermediate receiver element) can then be transferred for example by lamination to a receptor element of a flexible glass substrate or polarizing filter element of an LCD device for color filter array applications. After lamination, the intermediate receiver element is separated from the permanent receptor, to complete the transfer of the color image. Upon separation, the image receiving layer may remain with the color filter on the LCD. The image receiving layer can then act as a planarizing layer to provide a substantially planar layer on the outer surface of the LCD device and thereby obscure any nonuniformities in the thickness of the color filter layer.

Further Embodiments of the Donor Element:

Other donor elements may comprise additional thermally imageable layer or layers on a support. Additional layers may be present depending of the specific process used for imagewise exposure and transfer of the formed images. Some suitable donor elements are disclosed in U.S. Pat. Nos. 5,773,188, 5,622,795, 5,593,808, 5,334,573, 5,156,938, 5,256,506, 5,427,847, 5,171,650 and 5,681,681.

Figure 2:
FIG. 2 is a simplified schematic diagram of a receiver element of the invention.

Receiver Element:

The receiver element (20), shown in FIG. 2, is the second part of the laserable assemblage, to which the exposed areas of the thermally imageable layer are transferred. In most cases, the exposed areas of the thermally imageable layer will not be removed from the donor element in the absence of a receiver element. That is, exposure of the donor element alone to laser radiation does not cause material to be removed, or transferred. The exposed areas of the thermally imageable layer, are removed from the donor element only when it is exposed to laser radiation and the donor element is in contact with or adjacent to the receiver element. Typically, the donor element actually touches the receiver element. The surface of the donor element or the receiver and/or both may be roughened to improve contact between the two elements.

The receiver element (20) may be non-photosensitive or photosensitive. When the receiver element is non-photosensitive, preferably, it comprises a receiver support (21) and at least one image receiving layer (22). The receiver support (21) comprises a dimensionally stable sheet material. The assemblage can be imaged through the receiver support if that support is a transparent material. Examples of transparent materials, typically include transparent films, for example polyethylene terephthalate, polyether sulfone, a polyimide, a poly(vinyl alcohol-co-acetal), polyethylene, or a cellulose ester, such as cellulose acetate. Examples of opaque support materials include, for example, polyethylene terephthalate filled with a white pigment such as titanium dioxide, ivory paper, or synthetic paper, such as Tyvek® spunbonded polyolefin. Paper supports are typical and are preferred for proofing applications, while a polyester support, such as poly(ethylene terephthalate) is typical and is preferred for a medical hardcopy and color filter array applications. Supports which have a roughened surface may also be used in the receiver element.

The image-receiving layer (22) may be a coating of, for example, a polycarbonate; a polyurethane; a polyester; polyvinyl chloride; styrene/acrylo-nitrile copolymer; poly (caprolactone); vinylacetate copolymers with ethylene and/or vinyl chloride; (meth)acrylate homopolymers (such as butyl-methacrylate) and copolymers, polycaprolactone; and mixtures thereof. Capa® 650 (melt range 58–60° C.) used alone or blends made from about 5 to about 40% Capa® 650 (melt range 58–60° C.) and/or Tone® P-300 (melt range 58–62° C.), both polycapro-lactones, and optionally polyesters are also useful in this invention. Typically, the image receiving layer for the color proofing application may comprise two separate layers wherein the layer adjacent the receiver support is a vinyl acetate copolymer such as polyethylene/polyvinyl acetate and the outer layer comprises a polyester. Useful receiver elements are also disclosed in U.S. Pat. No. 5,534,387 issued on Jul. 9, 1996. One preferred example is the WATERPROOF® Transfer Sheet sold by DuPont. Typically, it has an ethylene/vinyl acetate copolymer in the surface layer comprising more ethylene than the vinyl acetate.

This image-receiving layer can be present in any amount effective for the intended purpose. In general, good results have been obtained at coating weights of range of about 10 to about 150 $mg/dm^2$, more typically in the range of about 40 to about 60 $mg/m^2$.

In addition to the image-receiving layer, the receiver element may optionally include one or more other layers (not shown) between the receiver support and the image receiving layer. One such additional layer between the image-receiving layer and the support is a release layer. The receiver support alone or the combination of receiver support and release layer may also be referred to as a first temporary carrier. The release layer can provide the desired adhesion balance to the receiver support so that the image-receiving layer adheres to the receiver support during exposure and separation from the donor element, but promotes the separation of the image receiving layer from the receiver support upon transfer, for example by lamination, of the image receiving layer to a permanent substrate or support. Examples of materials suitable for use as the release layer include polyamides, silicones, vinyl chloride polymers and copolymers, vinyl acetate polymers and copolymers and plasticized polyvinyl alcohols. The release layer can have a thickness in the range of about 1 to about 50 microns. A cushion layer which is a deformable layer may also be present in the receiver element, typically between the release layer and the receiver support. The cushion layer may be present to increase the contact between the receiver element and the donor element when assembled. Examples of suitable materials for use as the cushion layer include polyesters, copolymers of styrene and olefin monomers such as styrene/ethylene/butylene/styrene, styrene/butylene/styrene block copolymers, and other elastomers useful as binders in flexographic plate applications.

The receiver element may be an intermediate element in the process of the invention because the laser imaging step is normally followed by one or more transfer steps by which the exposed areas of the thermally imageable layer are transferred to the permanent substrate.

Image Rigidification Element

In one particular embodiment, the invention further comprises the steps of contacting the image on the image receiving layer of the receiver element with an image rigidification element comprising:

(a) a support having a release surface, and (b) a image rigidification layer, the image being adjacent the image rigidification layer during said contacting, whereby the image is encased between the image rigidification layer and the image receiving layer of the receiving element; removing the support having a release surface thereby revealing the image rigidification layer; and contacting the revealed image rigidification layer with a permanent substrate.

Thus, in a printed proof there would be an image receiving layer having an outer surface with a halftone dot thermal image applied thereto by imagewise exposure of a donor element comprising a thermally imageable layer of this invention; and an image rigidification layer having a first surface and a second surface, the outer surface of the image receiving layer being located on the first surface thereof and a final receptor located on the second surface thereof, whereby the image is encased between the image receiving layer and the image rigidification layer.

Figure 3:
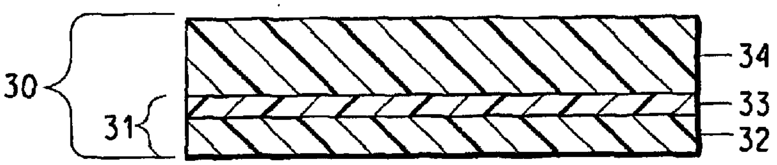
FIG. 3 is a simplified schematic diagram of the image rigidification element of the invention.

The image rigidification element (30), shown in FIG. 3, comprises a support (32) having a release surface (31), also referred to as a second temporary carrier, and an image rigidification layer (34) which serves to rigidify the image to hold it in place so that upon transfer to the final or temporary receptor, it does not shift which provides a clear image. The image rigidification layer also fixes the image so that it will not shift when another image is applied to the imaged surface of the receiver element.

The support (32) of the image rigidification element may included a released surface (33). If the material used as the support, has a release surface, e.g., polyethylene or a fluorophylemer, no additional surface layer is needed. The release surface (33) should have sufficient adhesion to the support (32) to remain affixed to the support throughout the proccesing steps of the invention. Almost any material that has reasonable stiffness and dimensional stability is useful as the support. Some examples of useful supports included polymeric films such as polyesters, including polyethylene terepthalate and polyethylene naphthanate; polyamides; polycarbonates; fluoropolymers; polyacetals; polyolefins, etc. The support may also be a thin metal sheet or a natural or synthetic paper substrate. The support may be transparent, translucent or opaque. It may be colored and may have incorporated therein additives such as fillers to aid in the movement of the image rigidification element through the lamination device during its lamination to the imaged receiver element.

The support may have antistatic layers coated on one or both sides for reducing static when the support is removed from the image rigidification layer during the process of the invention. It is generally preferred to have antistatic layers coated on the back side of the support, i.e., the side of the support away from the image rigidification layer. Materials which can be used as antistatic materials are well known in the art. Optionally, the support may also have a matte texture to aid in transport and handling of the image rigidification element.

The support of the image rigidification element typically has a thiclukess of about 20μ to about 250μ. A preferred thickness is about 55 to about 200μ.

The release surface of the support is generally a very thin layer which promotes the separation of the support from the image rigidification layer. Materials useful as release layers are well known in the art and include, for example, silicones; melamine acrylic resins; vinyl chloride polymers and copolymers; vinyl acetate polymers and copolymers; plasticized polyvinyl alcohols; ethylene and propylene polymers and copolymers; etc. When a separate release layer is coated onto the support, the layer generally has a thickness in the range of about 0.5 to about 10 micrometers.

The release surface (33) may also include materials such as antistats, colorants, antihalation dyes, optical brighteners, surfactants, plasticizers, coating aids, matting agents, and the like.

The thermoplastic polymers useful as the image rigidification layer (34) are preferably amorphous, i.e., non-crystalline, in character, have high softening points, moderate to high molecular weight and compatibility with the components of the image receiving polymer layer, e.g., polycaprolactone. Additionally, flexibility without cracking and possessing the capability to be attached to many different permanent substrates is advantageous. The polymer is preferably solvent soluble, has good solvent and light stability and is a good film former.

Many useful thermoplastic polymer materials are known which can be used as the image rigidification layer. Preferred for use in this invention are thermoplastic polymers having Tgs (glass transition temperatures) in the range of about 27 to about 150° C., preferably about 40 to about 70° C., and more preferably about 45 to about 55° C., a relatively high softening points, e.g., Tg of about 47° C., melt flow of about 142° C.). Other useful characteristics include a low elongation at break as determined by ASTM D822A, an elongation at break of 3 has been effective, and moderate weight average molecular weight (Mw), e.g., in the area of about 67,000. Polyester polymers, e.g., having a Tg of about 47° C., are preferred because good compatibility is achieved between the image receiving polymer, e.g., crystalline polycaprolactone, and the polyester polymer in the image rigidification layer. However, other suitable polymers have been shown to give acceptable results. Some suitable materials include methacrylate/acrylate, polyvinylacetate, polyvinylbutyral, polyvinylformal, styrene-isoprene-styrene and styrene-ethylene-butylene-styrene polymers, etc.

The thermoplastic polymer is present in the amount of about 60 to about 90%, preferably about 70 to about 85%, based on the total weight of the image rigidification layer.

The image rigidification layer and image receiving layer relate to each other in that the colored image is encased between them so that it does not move significantly during lamination to the permanent substrate, e.g., paper, and cooling. This significantly reduces halftone dot movement, swath boundary cracking and banding compared to similar processes not employing a image rigidification layer in this manner, i.e., an image rigidification element, and renders these defects barely perceptible and even eliminated.

The use of the image rigidification layer in the processes and products of this invention results in an increase in lamination throughput speeds from about 200 mm/min to approximately about 600 to about –800 mm/min (3–4 fold increase) without the introduction of defects, and provides lamination process latitude to allow image transfer to many different types of permanent substrates.

The image rigidification layer also provides a vehicle or mechanism for the introduction of bleaching chemistry to reduce the impact on final color associated with the NIR dye in the thermally imageable layer of the donor element to the permanent substrate.

Additives:

The image rigidification layer may also contain additives as long as they do not interfere with the functioning of this layer. For example, additives such as plasticizers, other modifying polymers, coating aids, surfactants can be used. Some useful plasticizers include polyethylene glycols, polypropylene glycols, phthalate esters, dibutyl phthalate and glycerine derivatives such triacetin. Preferably, the plasticizer is present in the amount of about 1 to about 20%, most preferably about 5 to about 15%, based on the total weight of the image rigidification layer. These plasticizers can be used in the thermally imageable layer.

As noted above, the image rigidification layer also preferably contains dye bleaching agents for bleaching the thermal amplification additive, such as an NIR dye, which may be present in the thermally imageable layer. Some useful bleaching agents include amines, azo compounds, carbonyl compounds and, organometallic compounds, carbanions, and hydantoins such as 1,3-dichloro-5,5-dimethyl hydantoin. Useful oxidants include peroxides, diacyl peroxides, peroxy acids, hydroperoxides, persulfates, and halogen compounds. Particularly useful dye bleaching agents with polymethine type NIR dyes are those selected from the group consisting of hydrogen peroxide, organic peroxides, hexaaryl biimidazoles, halogenated organic compounds, persulfates, perborates, perphosphates, hypochlorites, hydantoins and azo compounds. These bleaching agents may also be employed in the thermally imageable layer.

Dye bleaching agents are present in the amount of about 1 to about 20%, preferably about 5 to about 15%, based on the total weight of the image rigidification layer.

Permanent Substrate

One advantage of the process of this invention is that the permanent substrate, for receiving the image, can be selected from almost any sheet material desired. For most proofing applications a paper is used, preferably the same paper on which the image will ultimately be printed. Most any paper stock can be used. Other materials which can be used as the permanent substrate include cloth, wood, glass, china, most polymeric films, synthetic papers, thin metal sheets or foils, etc. Almost any material which will adhere to the image rigidification layer (34), can be used as the permanent substrate.

Proces Steps

Figure 4:
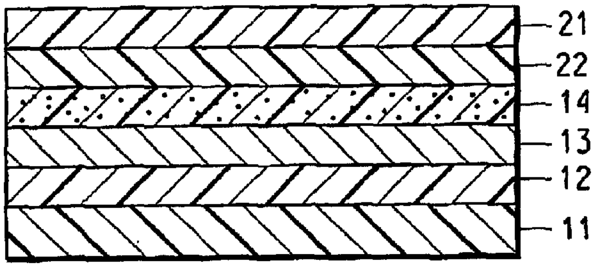
FIG. 4 is a simplified schematic diagram of the donor element in contact with the receiver element shown in FIG. 2.

Exposure:

The first step in the process of the invention is imagewise exposing the laserable assemblage, e.g., as shown in FIG. 4, to laser radiation. The exposure step is preferably effected at a laser fluence of about 600 $mJ/cm^2$ or less, most preferably about 250 to about 440 $mJ/cm^2$. The laserable assemblage comprises the donor element (10) and the receiver element (20).

As shown in FIG. 4, the assemblage is prepared following removal of coversheet(s), if present, by placing the donor element (10) in contact with the receiver element (20) such that the thermally imageable layer (14) actually contacts the image-receiving layer (22) of the receiver element. This is represented in FIG. 4. Vacuum and/or pressure can be used to hold the donor and receiver elements together. Alternately, the donor and receiver elements may be spaced slightly apart using spacer particles in the thermally imageable layer or the image receiving layer. As one alternative, the surfaces of the donor and/or receiver elements that are adjacent each other may be roughened, e.g., by embossing. As another alternative, the donor and receiver elements can be held together by fusion of layers at the periphery. As another alternative, the donor and receiver elements can be taped together and taped to the imaging apparatus, or a pin/clamping system can be used. As yet another alternative, the donor element can be laminated to the receiver element to afford a laserable assemblage. The laserable assemblage can be conveniently mounted on a drum to facilitate laser imaging.

Various types of lasers can be used to expose the laserable assemblage. The laser is preferably one emitting in the infrared, near-infrared or visible region. Particularly advantageous are diode lasers emitting in the region of 750 to 870 nm which offer a substantial advantage in terms of their small size, low cost, stability, reliability, ruggedness and ease of modulation. Diode lasers emitting in the range of 780 to 850 nm are most preferred. Such lasers are available from, for example, Spectra Diode Laboratories (San Jose, Calif.).

The exposure can take place through the optional intermediate layer of the donor element, if present, the thermally imageable layer of the donor element, or through the receiver element, provided that these are substantially transparent to the laser radiation. In most cases, the intermediate layer will be a film which is transparent to infrared radiation and the exposure is conveniently carried out through the intermediate layer. However, if the receiver element is substantially transparent to infrared radiation, the process of the invention can also be carried out by imagewise exposing the receiver element to infrared laser radiation.

The laserable assemblage is exposed imagewise so that the exposed areas of the thermally imageable layer are transferred to the receiver element in a pattern. The pattern itself can be, for example, in the form of dots or line work generated by a computer, in a form obtained by scanning artwork to be copied, in the form of a digitized image talken from original artwork, or a combination of any of these forms which can be electronically combined on a computer prior to laser exposure. The laser beam and the laserable assemblage are in constant motion with respect to each other, such that each minute area of the assemblage, i.e., "pixel" is individually addressed by the laser. This is generally accomplished by mounting the laserable assemblage on a rotatable drum. A flat bed recorder can also be used.

The next step in the process of the invention is separating the donor element from the receiver element. Usually this is done by simply peeling the two elements apart. This generally requires very little peel force, and is accomplished by simply separating the donor support from the receiver element. This can be done using any conventional separation technique and can be manual or automatic without operator intervention.

Figure 5:
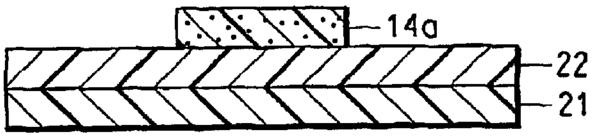
FIG. 5 is a simplified schematic diagram of the imaged receiver element of the invention.

As shown in FIG. 5, separation results in a laser generated color image, also known as the colored image, preferably a halftone dot image, comprising the transferred exposed areas of the thermally imageable layer being revealed on the image receiving layer of the receiver element. Typically the image formed by the exposure and separation steps is a laser generated halftone dot color image formed on an image receiving layer.

Figure 5A:
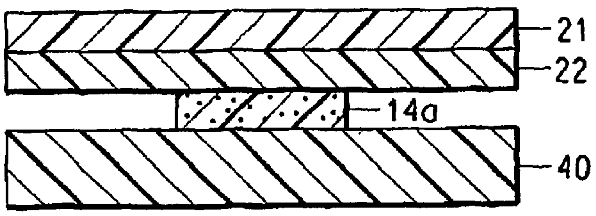
FIG. 5*a* is a simplified schematic diagram of an imaged permanent substrate of the invention.

As shown in FIG. 5*a*, this image may then be laminated to the permanent substrate (40), and the transfer support (21) peeled off to transfer the image (14*a*) and the image receiving layer (22) to the permanent substrate (40).

Figure 6:
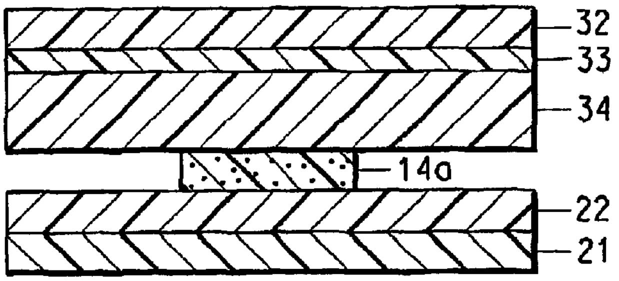
FIG. 6 is a simplified schematic diagram of an image rigidification element shown in FIG. 3 in contact with an imaged receiver element of FIG. 5.

Lamination of the Image Rigidification Element:

Alternately, the image rigidification element (30) may then be brought into contact with, typically laminated to, the image receiver element (20) with the colored image (14*a*) in contact with the image rigidification layer (34) of the image rigidification element (30) resulting in the image rigidification layer (34) of the rigidification element and the image receiving layer (22) of the receiver element encasing the color image. See FIG. 6. A WATERPROOF® Laminator, manufactured by DuPont is preferably used to accomplish the lamination. However, other conventional means may be used to accomplish contact of the image carrying receiver element with the image rigidification layer of the image rigidification element. It is important that the adhesion of the release surface (33) of the image rigidification element to the image rigidification layer (34) be less than the adhesion between any other layers in the assemblage shown in FIG. 6. The assemblage shown in FIG. 6 is highly useful, e.g., as an improved image proofing system.

Figure 6A:
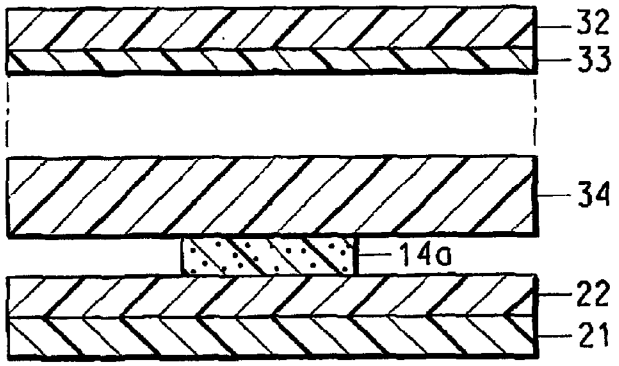
FIG. 6*a* is another simplified schematic diagram of an imaged receiver element of FIG. 5 with an image rigidification layer of FIG. 3.

Transfer of the Image to the Permanent Substrate:

The support (32) is then removed, typically by peeling off, to reveal the thermoplastic film as seen in FIG. 6*a*. The image on the receiver element is then transferred to the permanent substrate by contacting the permanent substrate with, preferably laminating it to, the revealed image rigidification layer of the assemblage shown in FIG. 6*a*. Again a WATERPROOF® Laminator, manufactured by DuPont is preferably used to accomplish the lamination. However, other conventional means may be used to accomplish this contact which results in the assemblage shown in FIG. 7.

Figure 8:
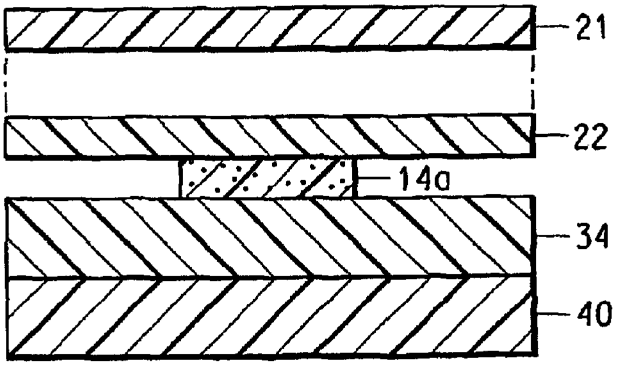
FIG. 8 is a simplified schematic diagram of a final element, e.g., a printed proof, of this invention.

Another embodiment includes the additional step of removing, typically by peeling off, the receiver support (21) (also known as the first temporary carrier), resulting in the assemblage shown in FIG. 8.

Figure 7:
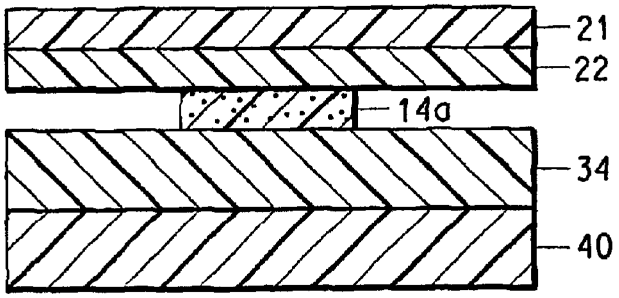
FIG. 7 is a simplified schematic diagram of the imaged receiver element of FIG. 6*a* applied to a permanent substrate (40) in accordance with this invention.

Typically, the assemblages illustrated in FIGS. 7 and 8 represent a printing proof comprising a laser generated halftone dot color thermal image formed on an image receiving layer such as a polyester layer, and an image rigidification layer laminated on one surface to said image receiving layer and laminated on the other surface to the permanent substrate, whereby the image is encased between the image receiving layer and the image rigidification layer.

Formation of Multilayer Images:

The receiver element can be an intermediate element onto which a multilayer or multicolor image is built up. In the following, a colorant can be substituted for an immiscible compound. A donor element having a thermally imageable layer comprising a first colorant is exposed and separated as described above. The receiver element has an image formed with the first colorant, which is preferably a laser generated halftone dot color thermal image. Thereafter, a second donor element having a thermally imageable layer different than that of the first donor element forms a laserable assemblage with the receiver element having the image of the first donor element and is imagewise exposed and separated as described above. The steps of (a) forming the laserable assemblage with a donor element having a different colorant than that used before and the previously imaged receiver element, (b) exposing, and (c) separating are sequentially repeated as often as necessary in order to build the multicolored image of a color proof on the receiver element.

The rigidification element may then be brought into contact with, typically laminated to, the multiple colored images on the image receiver element with the last colored image in contact with the image rigidification layer. The process is then completed as described above.

EXAMPLES

These non-limiting examples demonstrate the processes and products claimed and described herein wherein images of a wide variety of colors are obtained. All temperatures throughout the specification are in ° C. (degrees Centigrade) and all percentages are weight percentages unless indicated otherwise.

Glossary f is laser fluence in Watts.

Near Infrared Dyes:

| | |
|---|---|
| TIC/5C | 3-H-Indolium,2-[2-[2-chloro-3-dihydro-1,3,3-trimethyl-2H-indol-2-ylidene)ethylidene]-1-cyclopenten-1-yl]ethyenyl]-1,3,3-trimethyl-, salt with trifluoromethane sulfonic acid (1:1), CAS # 128433-68-1 |
| ADS 830 | 2-(2-(2-chloro-3-(2-(1,3-dihydro-1,1-dimethyl-3-(4-sulfo-butyl)-2H-benz[e]indol-2-ylidene)ethylidene)-1-cyclohexene-1-yl)ethenyl)-1,1-dimethyl-3-(4-sulfobutyl)-1H-benz[e]indolium, inner salt, free acid. CAS # 162411-28-1 |
| SQS | Thiopyrylium,4-((3-((2,6-bis(1,1-dimethylethyl)-4H-thio-pyran-4-ylidene)methyl)-2-hydroxy-4-oxo-2-cyclobuten-1-ylidene)methyl)-2,6-bis(1,1-dimethylethyl)-, inner salt, CAS # 88878-49-3 |
| DF-1704 | 3H-Indolium, 2-[2-[3-[(1,3-dihydro-1,3,3-trimethyl-2H-indol-2-ylidene)ethylidene]-2-(2-pyrimidinylthio)-1-cyclopenten-1-yl]ethenyl]-1,3,3-trimethyl-, salt with trifluoromethanesulfonic acid (1:1), CAS # 162093-14-3. |

Pigment Dispersions

| | |
|---|---|
| 144D | yellow 32Y144D at 40% solids (Penn Color, PA) |
| 145D | Yellow HR.32Y145D at 40% solids (Penn Color, PA) |
| 330D | Blue 32S330D (Penn color, PA) |
| 164 | Magenta 32R164 (Penn color, PA) |
| 166 | Violet 32R166 (Penn Color, PA) |
| RD | red P/D = 2, 15% solids (DuPont Auto) |

Surfactant

| | |
|---|---|
| FSA | Zonyl ® FSA fluoro (DuPont, Wilmington, DE) |
| FSD | Zonyl ® FSD fluoro (DuPont, Wilmington, DE) |

Dispersant

| | |
|---|---|
| RCP1 | graft polymer with a 69% backbone comprising butyl acrylate/methyl acrylate/acrylic acid (45.5/45.5/9) and 31% arms comprising methylmethacrylate/methacrylic acid (71.25/28.75) |
| RCP2 | Styrene/methacrylate copolymer (37.4% solids) (DuPont, Automotive, Philadelphia, PA) |
| RCP3 | Methylmethacrylate/n-butylmethacrylate (76/24) copolymer latex at 37.4% solids (DuPont, Wilmington, DE). |

Binder

| | |
|---|---|
| PEG | Polyethylene glycol 6800 molecular weight (Poly Sciences) |
| 103 | terpolymer of styrene (st), methyl-methacrylate, butyl acrylate (BA), methacrylic acid (MAA) and glycedol methylacrylate (GMA) to the following ratio (MMA:5/BA:80/Sty:10/ MAA:3/GMA:0.5) |
| 111 | terpolymer of styrene (sty), methyl-methacrylate (MMA), methacrylic acid (MAA) and glycedol methylacrylate (GMA) to the following ratio: (MMA:46.5/Sty:50/MAA:3/GMA:0.5) |

Cosolvent

AMP 2-amino-2-methyl-1-propanol

The following dispersions were prepared using the procedures outlined below. The proportions of ingredients were adjusted to have a 2% equivalent dye in each example.

Dye Dispersion 1 (DD1):

The dispersion in Table 1 was prepared by mixing together 16.67 gms. of a 60% dispersant solution in isopropanol, 60.07 gms. of water and 3.26 gr. of 50% 2-amino-2-methyl-1-propanol in water. 20 gms. of TIC/5C dye were added to this mixture. The mixture was run at 5000 rpm for 60 minutes on an Omni Mixer. The resultant dispersion could be easily re-dispersed with shalding if it settled. When the aqueous dispersion of TIC/5C described above was introduced in color filters and color proofing type formulations at 2% concentration, the optical absorption at 850 nm was 1.6.

TABLE 1

| Dye dispersion 1 (DD1) | solids (gr.) | weight (gr.) |
|---|---|---|
| TIC/5C | 20 | 20 |
| RCP1 (DISPERSANT) (60% SOLIDS) | 10 | 16.67 |
| AMP (50% solids) | 1.63 | 3.26 |
| Water | 60.07 | |
| Total Solids | 100.0 | |
| % Solids | 30 | |
| % TIC-5C | 20 | |
| Viscosity: | 17.9 CP | |
| pH 7.5 | | |
| P/D (pigment to dispersant ratio): 2/1 | | |

Dye Dispersion 2 (DD2):

The dispersion in Table 2 was prepared by mixing together 2.5 gms. of a 60% dispersant solution in isopropanol, 9.011 gms. of water and 0.489 gms. of 50% 2-amino-2-methyl-1-propanol in water. 3 gms. of ADS 830 absorber were added to this mixture. The mixture was run at 7500 rpm for 60 minutes on an Omni Mixer. The resultant dispersion could be easily redispersed with shaking if it settled. When the aqueous dispersion of SQS described above was introduced in color filters and color proofing type formulations at 2% concentration, the optical absorption at 830 nm was 1.34

TABLE 2

| Dye dispersion 2 (DD2) | solids (gr.) | weighed (gr.) |
|---|---|---|
| SQS | 3 | 3 |
| RCP1 (DISPERSANT) (60% SOLIDS) | 1.5 | 2.5 |
| AMP (50% solids) | 0.2445 | 0.489 |
| Water | 9.0 | 11 |
| Total Solids | 15.0 | |
| % Solids | 30 | |
| % Pigments | 20 | |
| P/D (pigment to dispersant ratio): 2/1 | | |

Preparation of the Thermally Imageable Layer Composition:

The composition of the thermally imageable layer of the donor element was prepared by mixing together the following ingredients:

Preparation of A Receiver Element:

A receiver element was prepared by coating CAPA650, polycaprolactone on a Mylar® substrate.

Example 1

This example shows the use of TIC/5C dye dispersion in a yellow pigmented layer of a donor element and the use of this element in a color proofing application. Six sample donor elements and a control were prepared. Each donor element comprises a 4 mil polyester backing (Melinex® 574) sputtered with about 70 Å of chromium by Vacuum Deposit Inc. (Louisville, Ky.). The metal thickness was monitored in situ using a quartz crystal and after deposition by measuring reflection and transmission of the films. Thermally imageable layers prepared from the control composition and 6 sample compositions specified in Table 3 were hand coated on the chromium layer using DuPont's WATERPROOF Color Versatility coater and a wire rod #6, followed by drying at 50° C. for 5 minutes.

TABLE 3

| Sample | Control (C1) | S1 | S2 | S3 | S4 | S5 | S6 |
|---|---|---|---|---|---|---|---|
| 144D | 4.19 | 2.095 | 2.095 | 2.095 | 2.095 | 2.095 | 2.095 |
| 145D | 0.84 | 0.42 | 0.42 | 0.42 | 0.42 | 0.42 | 0.42 |
| FSA | 0.15 | 0.075 | 0.075 | 0.075 | 0.075 | 0.075 | 0.075 |
| DD1 | | 0.7 | 0.52 | 0.35 | 0.7 | 0.52 | 0.35 |
| RCP2 | 28.33 | 14.165 | 14.25 | 14.35 | 15.06 | 15.11 | 15.16 |
| PEG | 1.05 | 1.65 | 1.65 | 1.65 | | | |
| 103 | | | | | 1.7 | 1.76 | 1.81 |
| ADS-830 | 0.28 | | | | | | |
| Water | 65.17 | 30.95 | 30.99 | 31.06 | 29.95 | 30.22 | 30.19 |
| Solution % | 100 | 50 | 50 | 50 | 50 | 50 | 50 |
| Solids % | 14.08 | 15 | 15 | 15 | 15 | 15 | 15 |

Each of the so prepared yellow donor elements and receiver element prepared as described above were placed in the cassette of a Creo 3244 Spectrum Trendsetter, Creo, Vancouver, BC, and imaged under the following conditions: yellow (13.0 watts, 100 and 200 rpm). The computer attached to the Trendsetter contained digital data files representing the 4 process colors (yellow, magenta, cyan and black).

This imaging equipment produced a laser generated yellow color thermal digital halftone image (proof) in reverse reading form on the Receiver Element from the digital image data file representing yellow. Exposure was effected at a laser fluence of about 250 mJ/$cm^2$.

The results show broad sensitivity over the range of 12 to 18 watts laser power, a high resolution as evidenced by the holding of 1 pixel checkerboard patterns, excellent overprints throughout the range and no border solid tearing (BST) over the range of 10 to 18 watt laser power.

The color image formed was then transferred to a LOE paper substrate. Alternately, the image was transferred to an image rigidification element comprising Vitel® 2700B polyester containing layer on a silicone release Mylar® substrate. The receiver support was peeled off and the image was contacted with an LOE paper substrate followed by peeling off of the image rigidification element support to form an image on the LOE paper substrate sandwiched between the polycaprolactone layer and the Vitel® 2700B polyester containing layer.

The results show that the images retained highlight dots and sharpness. The optical densities corresponding to the laser fluences (f) are shown in the table below:

TABLE 3A

| f | C1 | S1 | S2 | S3 | S4 | S5 | S6 |
|---|---|---|---|---|---|---|---|
| 10 | .85 | .59 | .15 | .67 | .1 | | |
| 11 | 1.1 | .57 | .71 | .67 | .31 | 1.15 | .46 |
| 12 | 1.26 | .69 | 1.11 | .94 | .83 | 1.43 | .79 |
| 13 | 1.32 | .94 | 1.31 | 1.06 | 1.25 | 1.52 | 1.36 |
| 14 | 1.36 | 1.31 | 1.42 | 1.14 | 1.39 | 1.55 | 1.53 |
| 15 | 1.37 | 1.46 | 1.51 | 1.38 | 1.45 | 1.53 | 1.56 |
| 16 | 1.38 | 1.47 | 1.51 | 1.42 | 1.48 | 1.54 | 1.54 |
| 17 | 1.39 | 1.48 | 1.54 | 1.51 | 1.50 | 1.54 | 1.56 |
| 18 | 1.38 | 1.48 | 1.57 | 1.53 | 1.52 | 1.53 | 1.56 |

The plot of these data shown in FIG. 9 illustrates the broad sensitivity over a laser power wattage of about 12 to about 18.

Example 2

Example 1 was repeated with the following exceptions: the thermally imageable layers were prepared from cyan color compositions shown in Table 4. Imaging was accomplished under the following conditions: cyan (14.5 watts, 135 rpm).

TABLE 4

| Sample | Control (C2) | S7 | S8 |
|---|---|---|---|
| 330D | 4.79 | 2.55 | 2.55 |
| FSA | 0.15 | 0.075 | 0.075 |
| DD1 | | 0.525 | 0.525 |
| RCP2 | 28.5 | 15.26 | 15.26 |
| PEG | 1.05 | 1.93 | |
| 103 | | | 1.76 |
| ADS-830 | 0.28 | | |
| Water | 62.6 | 29.652 | 29.83 |
| Solution | 100 | 50 | 50 |
| Solids % | 14.43 | 15 | 15 |

The results show a broad laser power and drum speed sensitivity range, a high resolution as evidenced by the holding of 1 pixel checkerboard patterns, excellent overprints throughout the range, and no Border Solid Tearing (BST) over the range of 10 to 18 watt laser power. The table below illustrates the optical density as a function of laser power (f) for the control (C2) and samples S7 and S8.

TABLE 4A

| f | C2 | S7 | S8 |
|---|---|---|---|
| 10 | 0.15 | 0.67 | 0.1 |
| 11 | 0.31 | 1.15 | 0.46 |
| 12 | 0.83 | 1.43 | 0.79 |
| 13 | 1.25 | 1.52 | 1.36 |
| 14 | 1.39 | 1.55 | 1.53 |
| 15 | 1.45 | 1.53 | 1.56 |
| 16 | 1.48 | 1.54 | 1.54 |
| 17 | 1.50 | 1.54 | 1.56 |
| 18 | 1.52 | 1.53 | 1.56 |

Figure 10:
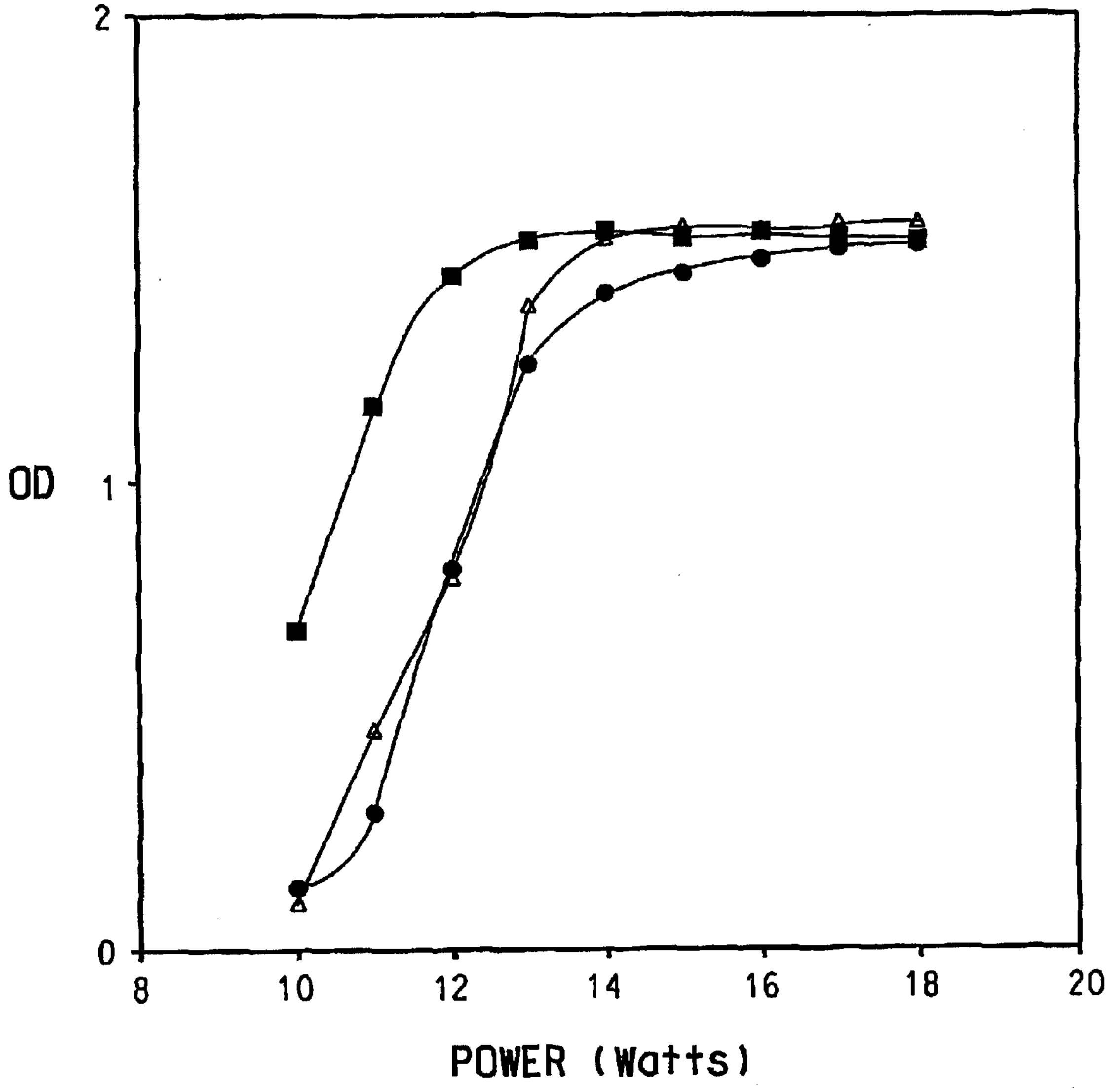
FIG. 10 is a plot of laser fluence v. optical density for the control and Samples 7 and 8 of Example 2.

The plot of these data shown in FIG. 10 illustrates the sensitivity of the instant compositions over a laser power range of about 12 to about 18 watts.

Example 3

Example 1 was repeated with the following exceptions: the thermally imageable layer were prepared from magenta color compositions shown in Table 5. Imaging for the control and samples S9 and S10 was accomplished under the following conditions: cyan (13.5 watts, 135 rpm).

TABLE 5

| Sample | Control (C3) | S9 | S10 |
|---|---|---|---|
| 164 | 7.04 | 3.562 | 3.562 |
| 166 | 0.38 | 0.1875 | 0.1875 |
| FSA | 0.14 | 0.075 | 0.075 |
| DD1 | | 0.525 | 0.7 |
| RCP2 | 27.89 | 13.21 | 13.125 |
| PEG | 1.05 | | 2.88 |
| 103 | | 2.64 | |
| ADS-4297 | 0.28 | | |
| Water | 63.05 | 29.80 | 29.47 |
| Solution | 99.93 | 50 | 50 |
| Solids gms | 14.91 | 7.544 | 7.5575 |

The table below illustrates the optical density as a function of laser power (f) for the control (C3) and samples S9 and S10:

TABLE 5A

| f | C3 | S9 | S10 |
|---|---|---|---|
| 10 | 0.66 | 1.41 | 0.58 |
| 11 | 1.21 | 1.45 | 1.28 |
| 12 | 1.47 | 1.48 | 1.36 |
| 13 | 1.54 | 1.51 | 1.40 |
| 14 | 1.53 | 1.50 | 1.42 |
| 15 | 1.52 | 1.51 | 1.40 |
| 16 | 1.55 | 1.50 | 1.42 |
| 17 | 1.53 | 1.49 | 1.43 |
| 18 | 1.57 | 1.50 | 1.43 |

Figure 11:
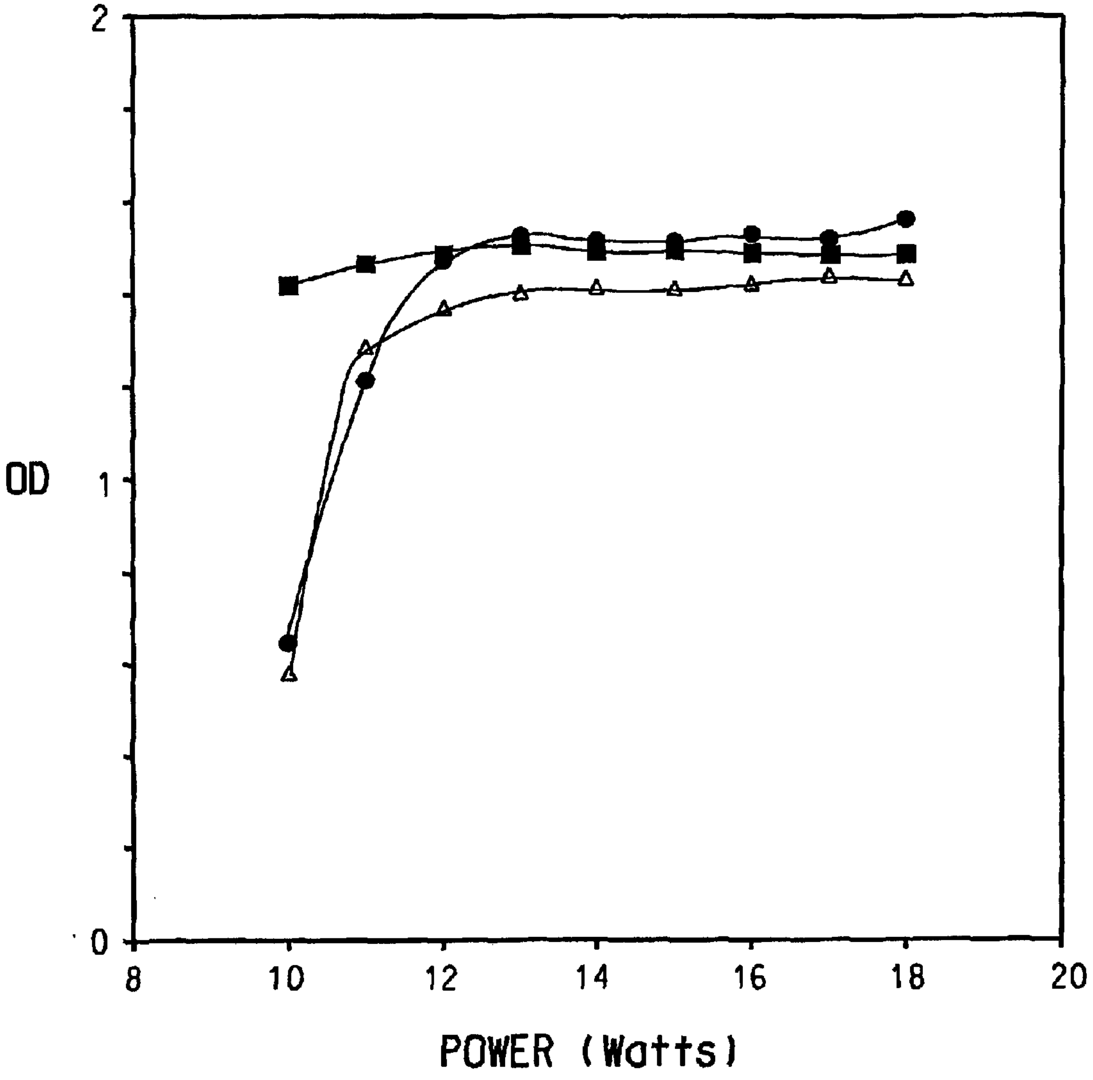
FIG. 11 is a plot of laser fluence v. optical density for the control and Samples 9 and 10 of Example 3.

The plot of FIG. 11 shows the broad laser power sensitivity range of 13 to 18 watts. A high resolution as evidenced by the holding of 1 pixel checker-board patterns, excellent overprints throughout the range, and reduced Border Solid Tearing (BST) with none present at high laser powers was also found.

Example 4

Example 1 was repeated with the following exceptions: the thermally imageable layers were prepared from yellow color compositions shown in Table 6 prepared from dispersions of SQS shown in Table 2.

TABLE 6

| Sample | control | 11 | 12 |
|---|---|---|---|
| 144D | 4.19 | 2.23 | 2.23 |
| 145D | 0.84 | 0.45 | 0.45 |
| FSA | 0.15 | 0.075 | 0.075 |
| DD2 | | 0.52 | 0.52 |
| RCP2 | 28.33 | 15.16 | 15.16 |
| PEG | 1.05 | 1.89 | |
| 103 | | | 1.70 |
| SQS | 0.28 | | |
| Water | 65.17 | 29.67 | 29.86 |
| Solution | 100 | 50 | 50 |
| Solids % | 14.08 | 15 | 15 |

The able below illustrates the optical density as a function of laser power (f) for control (C4) and samples S11 and S12:

TABLE 6A

| f | C4 | S11 | S12 |
|---|---|---|---|
| 14 | 1.14 | 1.43 | |
| 15 | 1.38 | 1.41 | 1.28 |
| 16 | 1.42 | 1.45 | 1.35 |
| 17 | 1.51 | 1.46 | 1.37 |
| 18 | 1.53 | 1.49 | 1.46 |
| 19 | 1.53 | 1.49 | 1.47 |
| 20 | 1.54 | 1.51 | 1.51 |

Figure 12:
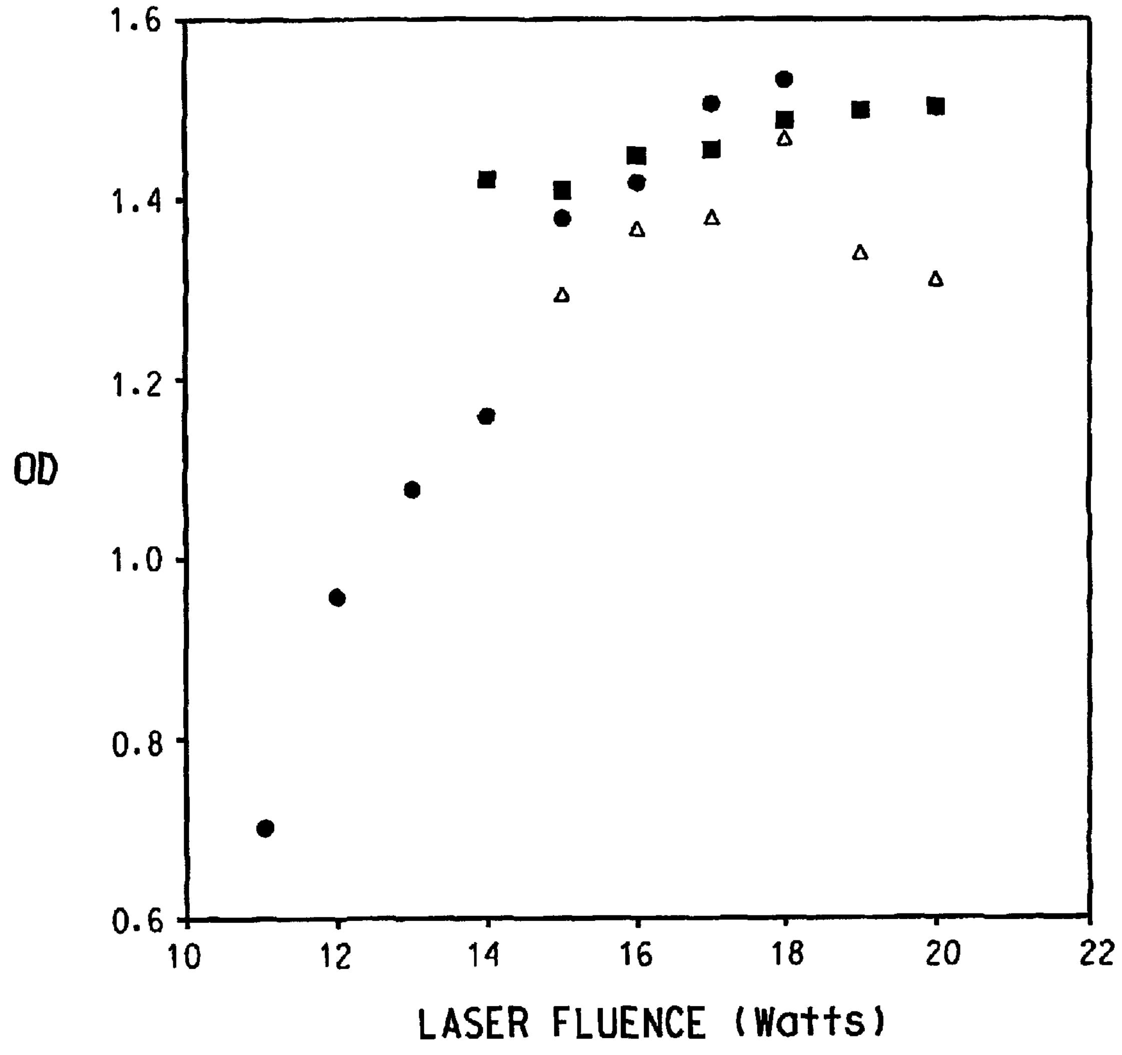
FIG. 12 is a plot of laser fluence v. optical density for the control and Sample 11 and 12 of Example 4.
Figure 13:
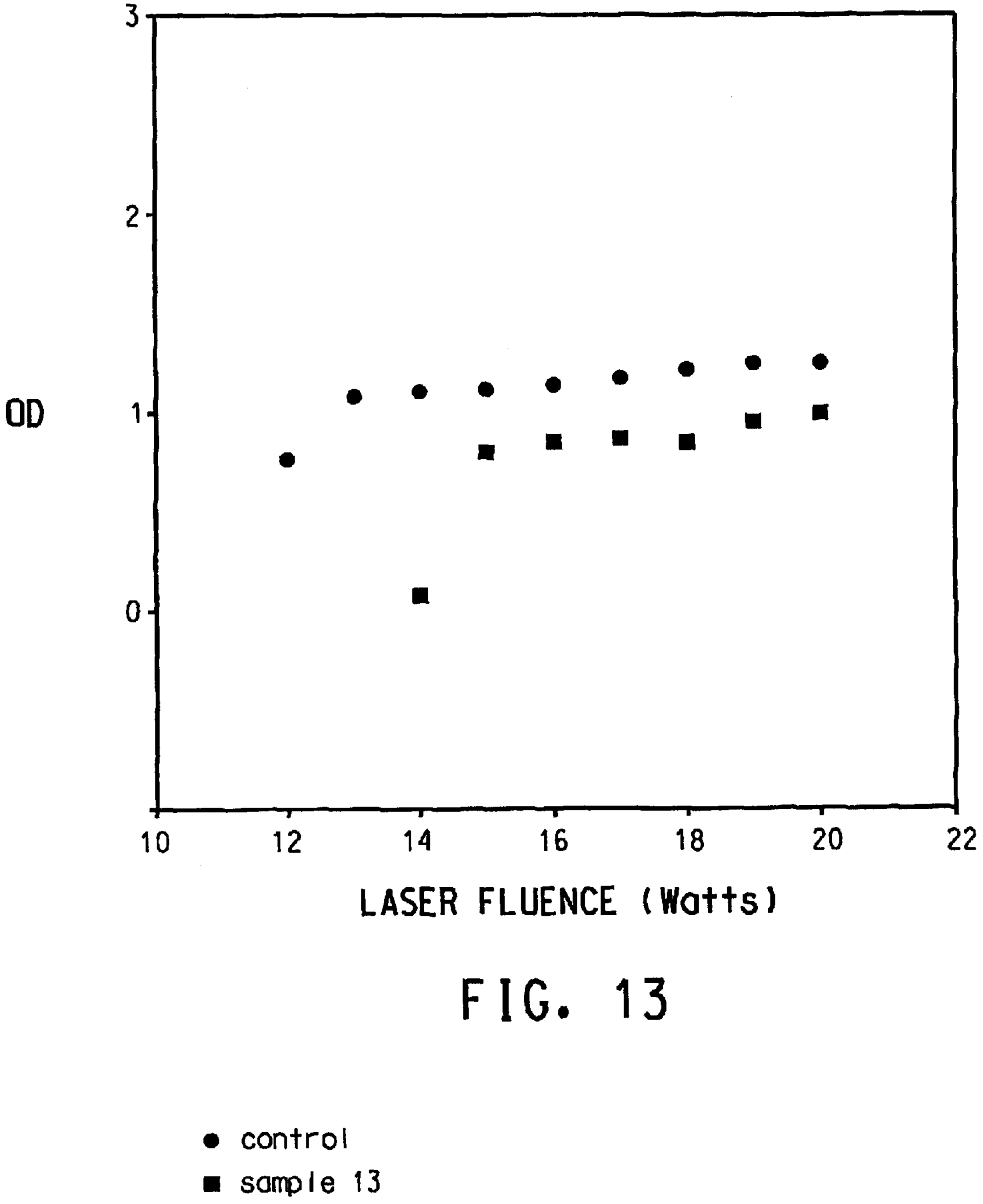
FIG. 13 is a plot of laser fluence v. optical density for the control and Sample 13 of Example 5.

The plot of FIG. 12 demonstrates the sensitivity of the coating compositions over the laser fluence of about 12 to about 20 watts.

Example 5

Example 1 was repeated with the following exceptions: the thermally imageable layers were prepared from compositions shown in Table 7 prepared from dispersions of TIC/5C shown in Table 1.

TABLE 7

| Sample | Control (C5) | S13 |
|---|---|---|
| RD | 30 | 30 |
| 111 | 7.24 | 7.24 |
| FSA | 0.0375 | 0.0375 |
| DD1 | | 0.52 |
| 103 | 1.278 | 1.278 |
| ADS-830 | 0.15 | |
| Water | 14.6 | 14.6 |
| Solution | 50 | 50 |
| Solids % | 15 | 15 |

The below illustrates the optical density as a function of laser power (f) for the control (C5) and sample S12:

TABLE 7A

| f | C5 | S13 |
|---|---|---|
| 12 | 0.76 | |
| 13 | 1.1 | |
| 14 | 1.14 | 0.25 |
| 15 | 1.15 | 0.79 |
| 16 | 1.18 | 0.87 |
| 17 | 1.22 | 0.89 |
| 18 | 1.26 | 0.87 |
| 19 | 1.30 | 1.0 |
| 20 | 1.32 | 1.03 |

Example 6

This example shows the use of water immiscible NIR dye, DF-1704, that is dispersed in neat form directly into a yellow donor composition, without the formation of a masterbatch. In this example, the water immiscible NIR dye was added to a polymer latex containing pigment. The latex binder identified as RCP3 to which the NIR dye of this example was added was made from a dispersion of the ingredients listed in Table 9a below.

TABLE 9a

| Ingredients | Parts per hundred | Function |
|---|---|---|
| deionized water | 58.8 | solvent |
| methy methacrylate | 26.21 | polymer |
| n-butyl methacrylate | 9.00 | polymer |
| ammonium laurel sulfate | 3.49 | surfactant |
| PolyStep B-1* | 1.75 | surfactant |
| ammonium persulfate | 0.22 | polymer initiator |
| 2-amino-2-methyl-1-propanol | 0.52 | solvent |
| Total | 99.99 | |

*ammonium nonylphenol ethoxylate sulfate commercially available from Stepan Company of Northfield, Illinois.

TABLE 9b

| Ingredient | Control (C6) | S14 |
|---|---|---|
| Water | 65.185 | 65.299 |
| RCP3 | 24.365 | 24.182 |
| 144D | 7.672 | 7.672 |
| 145D | 1.533 | 1.533 |
| ADS 830 | 0.212 | |
| DF-1704 | — | 0.28 |
| FSD | 0.14 | 0.14 |
| PEG 6800 | 0.894 | 0.894 |
| Total | 100.0 | 100.0 |

A sample donor element and a control were prepared from a dispersion of the ingredients listed in Table 9a, above. Each donor element comprises a 4 mil polyester backing (Melinex® 574, DuPont Teijin Films) sputtered with chromium at a transmittance of 60%. The thermally imageable coatings were hand coated on the chromium layer using a wire wound rod to a dried coating weight of approximately 6 mg/sq dm. Absorption spectra of each film showed the presence of incorporated dye.

The films were imaged using the Creo 3244 Spectrum Trendsetter, Creo, Vancouver, BC, and imaged at 18 watts, 180 rpm, and 60 SD. The imaging equipment produced a laser generated yellow color image on a receiver element for both C6 and S14. The color image formed was then transferred to an image rigidification element comprising Vitel® 2700B polyester on a silicone release Mylar® substrate. The receiver support was peeled off and the image was contacted with an LOE paper substrate followed by peeling off the image rigidification element support to form an image on LOE paper substrate sandwiched between the polycaprolactone layer and the Vitel® 2700B polyester containing layer.

After imaging, each imaged film on LOE paper was analyzed spectroscopically and found to possess characteristic NIR dye absorbance in the actinic region of 830–850 nm. Table 10 shows the reflectance data of solid images of each film on LOE paper in which the LOE paper served as a reference. The data shows that the immiscible dye, DF-1704, was successfully dispersed into the donor composition as evidenced by its absorption in the imaged proof.

TABLE 10

| Sample | Pigment $\lambda_{max}$ | Pigment Absorbance at $\lambda_{max}$ | Dye $\lambda_{max}$ | Dye Absorbance at $\lambda_{max}$ |
|---|---|---|---|---|
| C6 | 430 nm | 0.7 au | 841 nm | 0.17 au |
| S14 | 430 nm | 1.1 au | 836 nm | 0.46 au |

What is claimed is:

1. A donor element comprising a thermally imageable layer prepared from an aqueous dispersion comprising an immiscible thermal amplification additive and a polymeric dispersant wherein the thermal amplification additive comprises an IR absorbing compound selected from the group consisting of:

(a) 3-H-Indolium,2-[2-[2-chloro-3-dihydro-1,3,3-trimethyl-2H-indol-2-ylidene)-ethylidene]-1-cyclopenten-1-yl]ethyenyl]-1,3,3-trimethyl-, salt with trifluoroinethane sulfoniic acid (1:1);

(b) 3H-Indolium, 2-[2-[3-[(1,3-dihydro-1,3,3-trimethyl-2H-indol-2-ylidene)ethylidene]-2-(2-pyrimidinylthio)-1-cyclopenten-1-yl]ethenyl]-1,3,3-trimethyl-, salt with trifluoromethanesulfonic acid (1:1);

(c) 2-(2-(2-chloro-3-(2-(1,3-dihydro-1,1-dimethyl-3-(4-sulfobutyl)-2H-benz[e]indol-2-ylidene)ethylidene)-1-cyclohexene-1-yl)ethenyl)-1,1-dimethyl-3-(4-sulfobutyl)-1H-benz[e]indoliun, inner salt, free acid; and (d) Thiopyrylium, 4-((3-((2,6-bis(1,1-dimethylethyl)-4H-thiopyran-4-ylidene)methyl)-2-hydroxy-4-oxo-2-cyclobuten-1-ylidene)methyl)-2,6-bis(1,1-dimethylethyl)-, inner salt.

2. The donor element of claim 1 wherein the aqueous dispersion is made by a master batch process or the aqueous dispersion is made in a one-batch process.

3. The donor element of claim 1 in which the dispersant comprises a monomer which is an alkyl acrylate, alkyl methacrylate, acrylic acid, methacrylic acid or styrene, the alkyl group containing about 1 to 6 carbon atoms.

4. The donor element of claim 3 in which the dispersant is (a) a graft polymer with a backbone comprising an acrylic polymer with acrylic polymer arms wherein the backbone is a copolymer of one or more acrylates and acrylic acid at least one arm is a copolymer of an acrylate and acrylic acid, (b) a copolymer of styrene and methacrylate or (c) a copolymer of methyl methacrylate and n-butylmethacrylate.

5. The donor element of claim 1 which is for a color filter.

6. The donor element of claim 1 in which the thermally imageble layer further comprises a polymer which is cross-linkable.

7. The donor element of claim 1 which is for a color filter.

8. A method for making an image comprising:

(1) imagewise exposing to laser radiation a laserable assemblage comprising:

(A) a donor element comprising a thermally imageable layer prepared from an aqueous dispersion comprising an immiscible thermal amplification additive and a dispersant wherein the thermal amplification additive is an IR absorbing compound selected from the group consisting of:

(a) 3-H-Indolium,2-[2-[2-chloro-3-dihydro-1,3,3-trimethyl-2H-indol-2-ylidene)ethylidene]-1-cyclopenten-1-yl]etlhyenyl]-1,3,3-trimethyl-, salt with trifluoromethane sulfonic acid (1:1);

(b) 3H-Indolium, 2-[2-[3-[(1,3-dihydro-1,3,3-trimethyl-2H-indol-2-ylidene)ethylidene]-2-(2-pyrimidinylthio)-1-cyclopenten-1-yl]ethenyl]-1,3,3-trimethyl-, salt with trifluoromethanesulfonic acid (1:1);

(c) 2-(2-(2-chloro-3-(2-(1,3-dihydro-1,1-dimethyl-3-(4-sulfobutyl)-2H-benz[e]indol-2-ylidene)ethylidene)-1-cyclohexene-1-yl)ethenyl)-1,1-dimethyl-3-(4-sulfobutyl)-1H-benz[e]indolium, inner salt, free acid; and (d) Thiopyrylium,4-((3-((2,6-bis(1,1-dimethylethyl)-4H-thiopyran-4-ylidene)methyl)-2-hydroxy-4-oxo-2-cyclobuten-1-ylidene)methyl)-2,6-bis(1,1-dimethylethyl)-, inner salt; and (B) a receiver element in contact with the thermally imageable layer of the donor element; the receiver element comprising:

(a) an image receiving layer; and (b) a receiver support;

whereby the exposed areas of the thermally imageable layer are transferred to the receiver element to form an image on the image receiving layer;

(2) separating the donor element (A) from the receiver element (B), thereby revealing the image on the image receiving layer of the receiver element;

(3) contacting the revealed image on the image receiving layer of the receiver element with a permanent substrate, with the image in contact with the permanent substrate; and (4) separating the receiver support from the image receiving layer to transfer the image and the image receiving layer to the permanent substrate.

9. The method of claim 8 further comprising:

(3) contacting the image on the image receiving layer of the receiver element with an image rigidification element comprising:

(c) a support having a release surface, and (d) a image rigidification layer, the image being adjacent the image rigidification layer during said contacting, whereby the image is encased between the image rigidification layer and the image receiving layer of the receiving element;

(4) removing the support of the receiver element to reveal the image rigidification layer; and (5) contacting the revealed image rigidification layer from step (4) with a permanent substrate.

10. The method of claim 8 wherein the thermally imageable layer further comprises a pigment.

11. A method for making an image comprising:

(1) imagewise exposing to laser radiation a laserable assemblage comprising:

(A) a donor element comprising a thermally imageable layer prepared from an aqueous dispersion comprising an immiscible thermal amplification additive and a dispersant wherein the thermal amplification additive is an IR absorbing compound selected from the group consisting of poly(substituted) phthalocyanine compounds and metal-containing phthalocyanine compounds; cyanine dyes; squarylium dyes; chalcogenopyryioacylidene dyes; croconium dyes; metal thiolate dyes; bis(chalcogenopyrylo) polymethine dyes; oxyindolizine dyes; bis(aminoaryl) polymethine dyes; merocyanine dyes; quinoid dyes, and mixtures thereof; and (B) a receiver element in contact with the thermally imageable layer of the donor element; the receiver element comprising:

(a) an image receiving layer; and (b) a receiver support;

whereby the exposed areas of the thermally imageable layer are transferred to the receiver element to form an image on the image receiving layer;

(2) separating the donor element (A) from the receiver element (B), thereby revealing the image on the image receiving layer of the receiver element;

(3) contacting the revealed image on the image receiving layer of the receiver element with a permanent substrate, with the image in contact with the permanent substrate; and (4) separating the receiver support from the image receiving layer to transfer the image and the image receiving layer to the permanent substrate.

12. The method of claim 8 in which the thermally imageable layer and the image receiving layer further comprise a polymer which is crosslinkable.

13. A printed proof comprising: an image receiving layer having an outer surface with a halftone dot thermal image applied thereto by imagewise exposure of a donor element comprising a thermally imageable layer comprising an aqueous dispersion comprising an immiscible thermal amplification additive and a dispersant wherein the thermal amplification additive is an IR absorbing compound selected from the group consisting of:

(a) 3-H-Indolium,2-[2-(2-chloro-3-dihydro-1,3,3-trimethyl-2H-indol-2-ylidene) ethylidene]-1-cyclopenten-1-yl]ethyenyl]-1,3,3-trimethyl-, salt with trifluoromethane sulfonic acid (1:1);

(b) 3H-Indolium, 2-[2-[3-[(1,3-dihydro-1,3,3-trimethyl-2H-indol-2-ylidene)ethylidene]-2-(2-pyrimidinylthio)-1-cyclopenten-1-yl]ethenyl]-1,3,3-trimethyl-, salt with trifluoromethanesulfonic acid (1:1);

(c) 2-(2-(2-chloro-3-(2-(1,3-dihydro-1,1-dimethyl-3-(4-sulfobutyl)-2H-benz[e]indol-2-ylidene)ethylidene)-1-cyclohexene-1-yl)ethenyl)-1,1-dimethyl-3-(4-sulfobutyl)-1H-benz[e]indolium, inner salt, free acid; and (d) Thiopyrylium,4-((3-((2,6-bis(1,1-dimethylethyl)-4H-thiopyran-4-ylidene)methyl)-2-hydroxy-4-oxo-2-cyclobuten-1-ylidene)methyl)-2,6-bis(1,1-dimethylethyl)-, inner salt; and and an image rigidification layer having a first surface and a second surface, the outer surface of the image receiving layer on the first surface and a final receptor on the second surface, whereby the image is encased between the image receiving layer and the image rigidification layer.

14. The printed proof of claim 13 wherein the thermally imageable layer further comprises a pigment.

15. The printed proof of claim 13 wherein the dispersant comprises a monomer which is an alkyl acrylate, alkyl methacrylate, acrylic acid, methacrylic acid or styrene, the alkyl group containing about 1 to 6 carbon atoms.

16. The printed proof of claim 13 in which the dispersant is (a) a graft polymer with a backbone comprising an acrylic polymer with acrylic polymer arms wherein the backbone is a copolymer of one or more acrylates and acrylic acid at least one arm is a copolymer of an acrylate and acrylic acid, (b) a copolymer of styrene and methacrylate or (c) a copolymer of methyl methacrylate and n-butylmethacrylate.

17. A method for making a color filter element on a substrate comprising thermally mass transferring a pigment colorant from a donor element to the substrate to form a pattern of at least one color on the substrate and then associating a liquid crystal display device with said pattern so that upon electronically addressing of liquid crystal within said liquid crystal within said liquid crystal display device at least a portion of the pattern of at least one color becomes visible, the donor element comprising a thermally imageable layer prepared from an aqueous dispersion comprising the pigment colorant, an immiscible thermal amplification additive and a polymeric dispersant, wherein the thermal amplification additive comprises an IR absorbing compound selected from the group consisting of:

(a) 3-H-Indolium, 2-[2-[2-chloro-3-dihydro-1,3,3-trimethyl-2H-indol-2-ylidene)-ethylidene]-1-1-cyclopenten-1-yl]ethyenyl]-1,3,3-trimethyl-, salt with trifluoromethane sulfonic acid (1:1);

(b) 3H-Indolium, 2-[2-[3-(1,3-dihydro-1,3,3-trimethyl-2H-indol-2-ylidene)ethylidene]-2-(2-pyrimidinylthio)-1-cyclopenten-1-yl]ethenyl]-1,3,3-trimethyl-, salt with trifluoromethanesulfonic acid (1:1):

(c) 2-(2-(2-chloro-3-(2-(1,3-dihydro-1,1-dimethyl-3-(4-sulfobutyl)-2H-benz[e]indol-2-ylidene)ethylidene)-1-cyclohexene-1-yl)ethenyl)-1,1-dimethyl-3-(4-sulfobutyl)-1H-benz[e]indolium, inner salt, free acid; and (d) Thiopyrylium,4-((3-((2,6-bis(1,1-dimethylethyl)-4H-thiopyran-4-ylidene)methyl)-2-hydroxy-4-oxo-2-cyclobuten-1-ylidene)methyl)-2,6-bis(1,1-dimethylethyl)-, inner salt.

18. A donor element comprising a thermally imageable layer prepared from an aqueous dispersion comprising an immiscible thermal amplification additive and a dispersant; wherein the thermal amplification additive is an IR absorbing compound selected from the group consisting of poly (substituted) phthalocyanine compounds and metal-containing phthalocyanine compounds; cyanine dyes; squarylium dyes; chalcogenopyryioacrylidene dyes; croconium dyes; metal thiolate dyes; bis(chalcogenopyrylo) polymethine dyes; oxyindolizine dyes; bis(aminoaryl) polymethine dyes; merocyanine dyes; quinoid dyes, and mixtures thereof.

19. The donor element of claim 18 in which the dispersant comprises a monomer which is an alkyl acrylate, alkyl methacrylate, acrylic acid, methacrylic acid or styrene, the alkyl group containing about 1 to 6 carbon atoms.

20. The donor element of claim 19 in which the dispersant is (a) a graft polymer with a backbone comprising an acrylic polymer with acrylic polymer arms wherein the backbone is a copolymer of one or more acrylates and acrylic acid at least one arm is a copolymer of an acrylate and acrylic acid, (b) a copolymer of styrene and methacrylate or (c) a copolymer of methyl methacrylate and n-butylmethacrylate.

21. The donor element of claim 18 in which the thermally imageable layer further comprises a polymer which is crosslinkable.

* * * * *